(12) United States Patent
Samir et al.

(10) Patent No.: US 12,620,986 B2
(45) Date of Patent: May 5, 2026

(54) DEVICE FOR MONITORING ONE OR A PLURALITY OF POWER SUPPLIES

(71) Applicant: Commissariat à l'Energie Atomique et aux Energies Alternatives, Paris (FR)

(72) Inventors: Anass Samir, Grenoble (FR); Bastien Giraud, Grenoble (FR); Sébastien Ricavy, Grenoble (FR)

(73) Assignee: Commissariat à l'Energie Atomique et aux Energies Alternatives, Paris (FR)

( * ) Notice: Subject to any disclaimer, the term of this patent is extended or adjusted under 35 U.S.C. 154(b) by 104 days.

(21) Appl. No.: 18/805,216

(22) Filed: Aug. 14, 2024

(65) Prior Publication Data

US 2025/0062762 A1 Feb. 20, 2025

(30) Foreign Application Priority Data

Aug. 18, 2023 (FR) ...................................... 2308779

(51) Int. Cl.
*H03K 17/22* (2006.01)

(52) U.S. Cl.
CPC .................................. *H03K 17/223* (2013.01)

(58) Field of Classification Search
None
See application file for complete search history.

(56) References Cited

U.S. PATENT DOCUMENTS

| | | | |
|---|---|---|---|
| 6,160,430 A | 12/2000 | Drapkin et al. | |
| 6,236,250 B1 | 5/2001 | Salmon et al. | |
| 6,593,790 B2 | 7/2003 | Kim | |
| 6,853,221 B1 | 2/2005 | Wert | |
| 6,870,400 B1 | 3/2005 | Chong et al. | |
| 9,654,096 B1 * | 5/2017 | Wadhwa .............. | H03K 17/145 |
| 9,729,138 B1 * | 8/2017 | Gonzales ............. | H03K 17/223 |
| 2006/0208777 A1 | 9/2006 | Ichikawa et al. | |

(Continued)

OTHER PUBLICATIONS

Khan, Qadeer Ahmad, and G. K. Siddhartha. "A sequence independent power-on-reset circuit for multi-voltage systems." In 2006 IEEE International Symposium on Circuits and Systems, pp. 4-pp. IEEE, 2006.

(Continued)

*Primary Examiner* — Jeffrey S Zweizig
(74) *Attorney, Agent, or Firm* — Jordan IP Law LLC

(57) ABSTRACT

A circuit comprises first, second, and third nodes (2002, 2004, 2006) respectively receiving a reference potential, a first voltage, and a second voltage. A first NMOS transistor has its gate connected to the second node. A second NMOS transistor has its drain and its source respectively connected to the source of the first transistor and to the second node. A third NMOS transistor has its gate and its source respectively connected to the second and first nodes. A fourth PMOS transistor has its drain connected to the drain of the third transistor and to the gate of the second transistor, and its gate connected to the source of the first transistor. A resistive element connects the first transistor to the third node, another resistive element connecting the fourth transistor to the third node.

12 Claims, 7 Drawing Sheets

(56)         References Cited

U.S. PATENT DOCUMENTS

| 2007/0080726 | A1 | 4/2007 | Khan et al. |
| 2010/0244805 | A1 | 9/2010 | Fujita |

OTHER PUBLICATIONS

Chang, Jui-Ming, and Massoud Pedram. "Energy minimization using multiple supply voltages." IEEE Transactions on Very Large Scale Integration (VLSI) Systems 5, No. 4 (1997): 436-443.
Preliminary Search Report for French application No. 2308779, mailed on Feb. 7, 2024, 2 pages.

\* cited by examiner

DEVICE FOR MONITORING ONE OR A PLURALITY OF POWER SUPPLIES

FIELD

The present disclosure generally concerns the monitoring of one or a plurality of power supply voltages, and more particularly power-on reset (POR) strategies.

BACKGROUND

Known chips more and more often comprise a plurality of power supply voltage domains and/or portions of the chip with circuits using a plurality of power supply voltages.

When a power supply voltage is turned off, it is in a high-impedance state. When it is turned on, or powered on, this power supply voltage first has a zero value, before reaching its nominal or target value at the end of a ramp-up phase. During the powering on and the ramping up of one or a plurality of power supply voltages of a portion of the chip, many problems arise in circuits which receive this or these power supply voltages in order to be powered.

Known circuits generate, during the ramping up of one or a plurality of power supply voltages, a reset signal which enables to set the circuits to be powered with this or these power supply voltage(s) to a known initial state.

However, these known power-on reset circuits have many disadvantages.

SUMMARY

There exists a need for a power-on reset circuit which overcomes all or part of the disadvantages of known power-on reset circuits.

For example, there exists a need for a power-on reset circuit which consumes less power than known power-on reset circuits.

For example, there exists a need for a power-on reset device which is independent from the ramp-up sequence of the power supply voltages that it monitors.

For example, there exists a need for a power-on reset device which delivers a reset signal having a defined state as soon as one of the power supply voltages monitored by the device is turned on and is no longer in a high-impedance state.

For example, there exists a need for a power-on reset device which allows an implementation with MOS (Metal Oxide Semiconductor) transistors having a breakdown voltage Vmax, while one of the power supply voltages monitored by this device has a nominal value higher than this breakdown voltage Vmax and/or the difference in values between two of the voltages monitored by the device may be greater than this breakdown voltage Vmax.

An embodiment overcomes all or part of the disadvantages of known power-on reset circuits and devices.

An embodiment provides a circuit comprising:

a first node configured to receive a reference potential;

a second node configured to receive a first DC voltage, the first DC voltage being a power supply voltage;

a third node configured to receive a second DC voltage;

a first NMOS transistor having its gate connected to the second node;

a second NMOS transistor having its drain connected to the source of the first transistor and its source connected to the second node;

a third NMOS transistor having its gate connected to the second node and its source connected to the first node;

a fourth PMOS transistor having its drain connected to the drain of the third transistor and to the gate of the second transistor, and its gate connected to the source of the first transistor;

a first resistive element connected between the drain of the first transistor and the third node;

a second resistive element connected between the source of the fourth transistor and the third node; and a first CMOS inverter configured to be powered with the second voltage, an input of the first inverter being connected to the drain of the third transistor and an output of the first inverter being configured to deliver a reset signal.

According to an embodiment, each of the first and second resistive elements is implemented by a PMOS transistor having its gate connected to the first node and its source connected to the third node.

According to an embodiment, the circuit further comprises a capacitive element connected between the gate and the source of the first transistor.

According to an embodiment, the circuit further comprises a second CMOS inverter configured to be powered with the second voltage, an input of the second inverter being connected to the output of the first inverter, and an output of the second inverter being configured to deliver a signal complementary to the reset signal.

According to an embodiment, the first and second resistive elements and the first and fourth transistors are sized so that the fourth transistor is off when the first transistor is on.

According to an embodiment, the second voltage is also a power supply voltage.

Another embodiment provides a device comprising:

at least one circuit such as defined above, and a voltage generation circuit configured to deliver the second DC voltage at a non-zero value prior to a powering on and a ramping up of the first voltage, the non-zero value being preferably adapted to allowing a switching to the on state of the fourth transistor from the powering-on of the first voltage.

According to an embodiment:

said at least one circuit comprises at least two circuits such as described hereabove;

the device comprises a CMOS logic gate configured to implement a Boolean AND logic function between the reset signals delivered by said at least two circuits, wherein:

the first nodes of said at least two circuits are configured to receive the same reference potential;

the third nodes of said at least two circuits are configured to receive the second voltage delivered by the voltage generation circuit, said second voltage being a reference voltage; and the second nodes of said at least two circuits are each configured to receive a first DC power supply voltage different from the first voltages received by the second nodes of the other circuits.

According to an embodiment, the CMOS logic gate is configured to be powered with the second voltage delivered by the voltage generation circuit.

According to an embodiment, the voltage generation circuit is configured to deliver the second DC reference voltage at its nominal value before the powering on and the ramping up of each of the first voltages.

According to an embodiment, the circuit for generating the second reference voltage comprises:

a first voltage dividing bridge connected between a first power supply node configured to receive one of the first DC power supply voltages and a second power supply node configured to receive the reference potential;

a first MOS transistor and a second resistive voltage dividing bridge connected in series between the first and second power supply nodes, the first transistor having its gate connected to an intermediate node of the first bridge and its source connected to the second power supply node;

a first buffer circuit configured to be powered with said first DC power supply voltage and comprising an input connected to a first intermediate node of the second bridge and an output configured to deliver the second reference voltage; and a second MOS transistor having its drain connected to the output of the first buffer circuit and its source connected to the first power supply node, wherein the first bridge is configured so that the first transistor is off when said one of the first DC power supply voltages is at a value lower than a first threshold, itself lower than a breakdown voltage of the transistors, and wherein the second transistor is configured to be in the on state if the first transistor is in the off state and conversely.

According to an embodiment, the circuit for generating the second reference voltage comprises:

a first voltage dividing bridge connected between a first power supply node configured to receive one of the first DC power supply voltages and a second power supply node configured to receive the reference potential;

a first MOS transistor and a second resistive voltage dividing bridge connected in series between the first and second power supply nodes, the first transistor having its gate connected to an intermediate node of the first bridge and its source connected to the first power supply node;

a second MOS transistor and a third resistive voltage dividing bridge connected in series between the first and second power supply nodes, the source of the second MOS transistor being connected to the second power supply node;

a buffer circuit configured to be powered with said one of the first DC power supply voltages and comprising an input connected to a first intermediate node of the third bridge and an output configured to deliver the second reference voltage; and a third MOS transistor having its drain connected to the output of the buffer circuit and its source connected to the first power supply node;

wherein the second transistor is configured to be in the off, respectively on, state when the first transistor is in the off, respectively on state, wherein the third transistor is configured to be in the on state if the second transistor is in the off state and conversely, and wherein the first bridge is configured so that the first transistor is off when said one of the first DC power supply voltages is at a value lower than a first threshold, itself lower than a breakdown voltage of the transistors.

BRIEF DESCRIPTION OF THE DRAWINGS

The foregoing features and advantages, as well as others, will be described in detail in the rest of the disclosure of specific embodiments given as an illustration and not limitation with reference to the accompanying drawings, in which.

DETAILED DESCRIPTION OF THE PRESENT EMBODIMENTS

Like features have been designated by like references in the various figures. In particular, the structural and/or functional features that are common among the various embodiments may have the same references and may dispose identical structural, dimensional and material properties.

For clarity, only those steps and elements which are useful to the understanding of the described embodiments have been shown and are described in detail.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following description, where reference is made to absolute position qualifiers, such as "front", "back", "top", "bottom", "left", "right", etc., or relative position qualifiers, such as "top", "bottom", "upper", "lower", etc., or orientation qualifiers, such as "horizontal", "vertical", etc., reference is made unless otherwise specified to the orientation of the drawings.

Unless specified otherwise, the expressions "about", "approximately", "substantially", and "in the order of" signify plus or minus 10%, preferably of plus or minus 5%.

Figure 1:
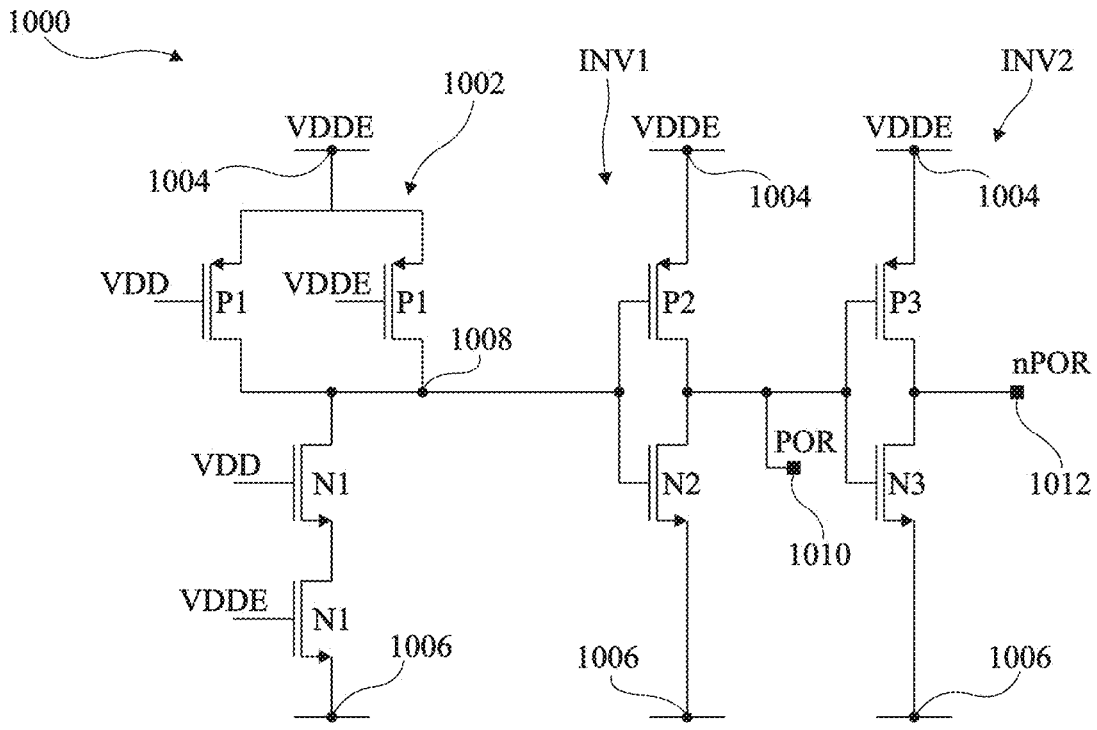
FIG. 1 shows an example of a power-on reset circuit.

FIG. 1 shows an example of a power-on reset circuit 1000.

In this example, circuit 1000 is configured to deliver a reset signal POR in a low binary state corresponding, for example, to a zero voltage when a circuit to be powered with two power supply voltages VDDE and VDD is to be reset, and in a high binary state corresponding, for example, to a voltage having a value equal to the nominal value of voltage VDEE when the ramping up of both voltages VDDE and VDD is complete, that is, when these two voltages VDDE and VDD have reached their respective nominal values. Thus, the low state of the POR signal causes the resetting of the circuit to be powered with voltages VDD and VDDE, and this reset phase ends when all voltages have completed their ramping up and the POR signal switches to the high state.

Circuit 1000 is powered with the voltage VDDE or voltage VDD which has the highest nominal value, that is, VDDE in this example. Thus, circuit 1000 comprises a node (or rail) 1004 configured to receive voltage VDDE, and a node (or rail) 1006 configured to receive a reference potential GND, for example the ground.

Circuit 1000 comprises a logic gate 1002 implemented in CMOS (Complementary MOS) technology, that is, a CMOS logic gate 1002. Gate 1002 is powered with voltage 1002.

Gate 1002 is configured to implement a Boolean logic NAND function between voltages VDDE and VDD, these voltages VDDE and VDD being delivered to respective inputs of gate 1002. Logic gate 1002 delivers the result of this Boolean logic operation on an output node 1008 of gate 1002.

Gate 1002 comprises as many PMOS transistors P1 as it has inputs, that is, two transistors P1 in this example. Transistors P1 are connected in parallel between nodes 1004 and 1008. Each transistor P1 has its gate connected to a different input of gate 1002. For example, a first transistor P1 has its gate connected to voltage VDD, or, in other words, has its gate configured to receive voltage VDD, and a second transistor P1 has its gate connected to voltage VDDE or, in other words, has its gate configured to receive voltage VDDE.

Further, gate 1002 comprises as many NMOS transistors N1 as it has inputs, that is, two N1 transistors in this example. Transistors N1 are connected in series between nodes 1008 and 1006. Each transistor N1 has its gate connected to a different input of gate 1002. For example, a first transistor N1 has its gate connected to voltage VDD, and a second transistor N1 has its gate connected to voltage VDDE.

Circuit 1000 further comprises an inverter INV1. Inverter INV1 is powered with voltage VDDE. The inverter has an input connected to the output node 1008 of gate 1002 and an output 1010 configured to deliver the POR signal.

Inverter INV1 is implemented in CMOS technology. More particularly, inverter INV1 comprises a PMOS transistor P2 connected between node 1004 and output 1010 and having its gate connected to node 1008, and an NMOS transistor N2 connected between output 1010 and node 1006 and having its gate connected to node 1008.

In this example, circuit 1000 further comprises an inverter INV2. Inverter INV2 is powered with voltage VDDE. Inverter INV2 is implemented in CMOS technology. Inverter INV2 has an input connected to the output 1010 of inverter INV1, and an output 1012 configured to deliver a signal nPOR complementary to the POR signal. More particularly, inverter INV2 comprises a PMOS transistor P3 connected between node 1004 and output 1012 and having its gate connected to node 1010, and an NMOS transistor N3 connected between output 1012 and node 1006 having its gate connected to node 1010.

Although an example of a circuit 1000 monitoring the ramping up of two power supply voltages VDDE and VDD has been described herein, those skilled in the art will are capable of adapting this example to the case where circuit 1000 monitors the ramping up of more than two power supply voltages, by increasing the number of inputs of gate 1002.

Circuit 1000 only detects the ramping up of the power supply voltage VDDE or VDD that it monitors which occurs last.

If all the power supply voltages monitored by circuit 1000 have completed their ramping up, then all transistors N1 are on, the output 1008 of gate 1002 is drawn to potential GND, or, in other words, a zero voltage is present at node 1008, and the POR signal is in a high state corresponding to the power supply voltage VDDE of circuit 1000.

If all the power supply voltages monitored by circuit 1000 have completed their ramping up, with the exception of at least one of the monitored power supply voltages, which is still at a zero value and which is not the power supply voltage of circuit 1000, then output 1008 is drawn to power supply voltage VDDE, and the POR signal is in a low state corresponding to a zero voltage.

On the other hand, as long as voltage VDDE is absent, that is, in a high-impedance state, then output 1008 is in a high-impedance state, like the POR signal.

Having a POR signal in an indefinite state while certain power supplies monitored by circuit 100 have already completed their ramping up is not desirable. Indeed, this may result in having floating nodes in the circuit to be powered with the monitored power supply voltages and receiving the POR signal. However, when the circuit to be powered has floating nodes and has already received power supply voltages which have completed their ramping up, this may result in malfunctions or a destruction of the circuit to be powered.

To avoid for the POR signal to be in an undefined state when one of the voltages monitored by circuit 1000 has completed its ramping up, for example when voltage VDD has reached its nominal value while voltage VDDE is absent, it has been provided to impose a turn-on sequence of the monitored power supply voltages, for example to impose for voltage VDDE to be delivered before voltage VDD. However, imposing a turn-on sequence of the power supply voltages is not always possible and, more generally, it is desirable not to impose such a turn-on sequence.

Further, when the difference between the value of voltage VDDE and the value of at least another one of the monitored voltages can take, during the powering on and the ramping up of these two supply voltages, values greater than the breakdown voltage Vmax of MOS transistors in a given technology, then circuit 1000 cannot be implemented in this technology.

Further, in circuit 1000, at the end of the ramping up of all the power supply voltages that it monitors, if one of the monitored voltages, for example voltage VDD, has a nominal value different from and lower than voltage VDDE, then the circuit consumes energy which is proportional to the difference between these nominal values, which is not desirable.

As an example, circuit 1000 is thus not adapted to a use as a power-on reset circuit for an RRAM (Resistive Random Access Memory) powered with voltages VDD and VDDE having, for example, nominal values respectively substantially equal to 1.8 V and 3.3 V.

Although an example of turn-on reset strategy and an example of a circuit 1000 implementing this strategy have been described herein, the other known turn-on reset strategies and the known circuits implementing them suffer from similar disadvantages.

For example, known turn-on reset strategies and known circuits implementing them require an imposed turn-on sequence of the power supply voltages that they monitor, so that the POR signal that they deliver to a circuit to be powered with these monitored power supply voltages is not in an undefined state when at least one of the monitored voltages has already completed its ramping up.

For example, known turn-on reset strategies and known circuits implementing them cannot be implemented in given technologies for which the breakdown voltage of the transistors is lower than values taken by the difference between two of the voltages monitored during the powering on and the ramping up thereof, for example the two previously-described voltages VDD and VDDE in circuit 1000.

For example, known circuits implementing known turn-on reset strategies exhibit a significant non-zero static power consumption when the monitored voltages have completed their ramping up and at least two of the monitored voltages have different nominal values.

Another example of a turn-on reset circuit (not illustrated by a drawing) is implemented based on a dual-input NAND gate. In other words, this other reset circuit comprises a NAND gate similar to the gate 1002 of FIG. 1, with the difference that the source of transistor P1 receiving voltage VDDE on its gate is connected to a node receiving voltage VDD, and not to node 1004 as in FIG. 1. This other circuit comprises, preferably, inverter INV1 connected to the output of the NAND gate, and, preferably, inverter INV2 connected to the output of inverter INV1.

In this other circuit, not shown, if voltage VDDE has finished its ramping up while voltage VDD is zero, the output of the NAND gate is drawn to voltage VDDE by transistor P1 controlled by voltage VDD, and, conversely, if voltage VDD has finished its ramping up while voltage VDDE is zero, the output of the NAND gate is drawn to voltage VDD by transistor P1 controlled by voltage VDDE. Thus, the POR output signal of inverter INV1 is in the low state.

Still in this other circuit, not illustrated, if voltage VDDE, respectively VDD, is absent, or, in other words, in a high-impedance state, while voltage VDD, respectively VDDE, has completed its ramping up, then the output of the dual-input NAND gate is in a high-impedance state, whereby, for example, the output POR signal of inverter INV1 also is in a high-impedance state.

Although this other circuit has advantages over circuit 1000, it is difficult to adapt this other turn-on reset circuit to examples where more than two power supply voltages are monitored. Further, this other turn-on reset circuit has at least some of the disadvantages of circuit 1000, such as static power consumption at the end of the ramping up of voltages VDDE and VDD which is proportional to the difference between these two voltages.

Figure 2:
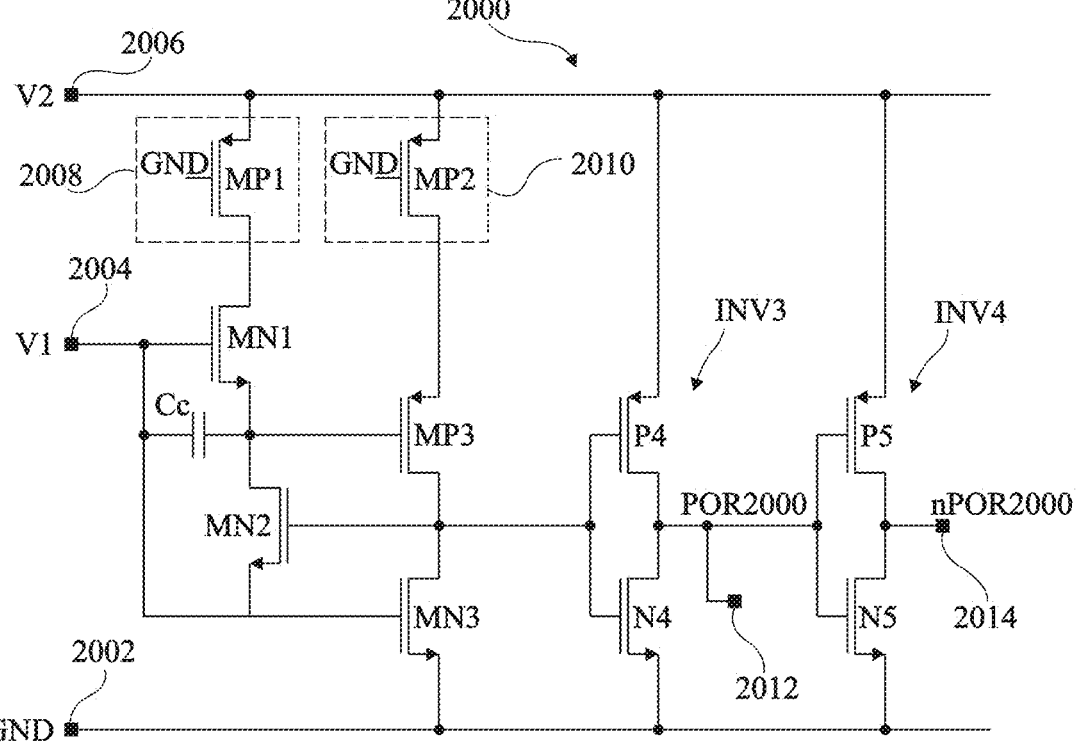
FIG. 2 shows an embodiment of a power-on reset circuit.

FIG. 2 shows an example of a power-on reset circuit 2000.

Circuit 2000 comprises a node 2002 configured to receive reference potential GND, a node 2004 configured to receive a first DC voltage V1, the first DC voltage being a power supply voltage monitored by circuit 2000, and a node 2006 for receiving another DC voltage V2.

Circuit 2000 comprises an NMOS transistor MN1. Transistor MN1 has its gate connected to node 2004. Circuit 2000 comprises an NMOS transistor MN2. The drain of transistor MN2 is connected to the source of transistor MN1 and the source of transistor MN2 is connected to node 2004. Circuit 2000 comprises an NMOS transistor MN3. The gate of transistor MN3 is connected to node 2004 and the source of transistor MN3 is connected to node 2002. Circuit 2000 comprises a PMOS transistor MP3. The drain of transistor MP3 is connected to the drain of transistor MN3, the drain of transistor MN3 being connected to the gate of transistor MN2. The gate of transistor MP3 is connected to the source of transistor MN1.

Further, circuit 2000 comprises a resistive element 2008 connected between the drain of transistor MN1 and node 2006. For example, resistive element 2008 has a terminal connected to the drain of transistor MN1 and a terminal connected to node 2006. Circuit 2000 also comprises a resistive element 2010 connected between the source of transistor MP3 and node 2006. For example, resistive element 2010 has a terminal connected to the source of transistor MP3 and a terminal connected to node 2006.

Circuit 2000 comprises an inverter INV3 implemented in CMOS technology. Inverter INV3 is powered with voltage V2, and, more generally, circuit 2000 is powered with voltage V2. An input of inverter INV3 is connected to the drain of transistor MP3, and thus to the drain of transistor MN3 and to the gate of transistor MN2. The output 2012 of inverter INV3 is configured to deliver a turn-on reset signal POR2000.

As an example, inverter INV3 comprises a PMOS transistor P4 connected between node 2006 and output 2012 and having its gate connected to the drains of transistors MP3 and MN3, and an NMOS transistor N4 connected between output 1012 and node 2002 and having its gate connected to the drains of transistors MP3 and MN3.

According to an embodiment, circuit 2000 comprises an optional capacitive element Cc connected between the gate and the source of transistor MN1.

According to an embodiment, when circuit 2000 is configured to deliver, in addition to circuit POR2000 on the output 2012 of inverter INV3, which is also an output of circuit 2000, a signal nPOR2000 complementary to signal POR2000, circuit 2000 comprises an inverter INV4 implemented in CMOS technology. Inverter INV4 is powered with voltage V2. An input of inverter INV4 is connected to the output 2012 of inverter INV3, and an output 2014 of inverter INV4 is configured to deliver signal nPOR2000.

As an example, inverter INV4 comprises a PMOS transistor P5 connected between node 2006 and output 2014 and having its gate connected to output 2012, and an NMOS transistor N5 connected between output 1014 and node 2002 and having its gate connected to output 2012.

According to an embodiment, each of resistive elements 2008 and 2010 is implemented by a respective PMOS transistor having its gate connected to node 2002 so as to receive potential GND and its source connected to node 2006. For example, resistive element 2008 is implemented by a PMOS transistor MP1 having its gate controlled by potential GND, its source connected to node 2006, and its drain connected to the drain of transistor MN1, and resistive element 2010 is implemented by a PMOS transistor MP2 having its gate controlled by potential GND, its source connected to node 2006, and its drain connected to the source of transistor MP3.

An advantage of implementing resistive elements 2008 and 2010 with PMOS transistors MP1 and MP2 rather than with resistors is that, for a similar bulk, the resistive elements will have higher resistance values, which enables to decrease the static power consumption of circuit 2000 as compared with the case where these resistive elements would have been implemented with resistors.

However, in alternative embodiments, resistive elements 2008 and 2010 are implemented with resistors.

To illustrate the operation of circuit 2000, the case where the turning on and the ramping up of voltage V1 are subsequent to the ramping up of voltage V2 is considered as an example.

This is for example the case when the two voltages are DC power supply voltages, for example, the respective voltages VDD and VDDE, of a circuit to be powered, having its setting controlled by the low state of signal POR2000, and a turn-on sequence is imposed on these voltages V1 and V2 so that voltage V2 has completed its ramping up before the turning on and the ramping up of voltage V1.

This may also be the case, for example, when voltage V2 is a reference voltage VrefH delivered by a reference voltage generation circuit configured to ensure that voltage VrefH is stable and at its nominal value before and during the turning on and the ramping up of voltage V1. This latter case occurs, for example, when the voltage V1 monitored by circuit 2000 is power a supply voltage of a circuit to be powered receiving a turn-on reset signal determined by signal POR2000, and voltage V2 (or VrefH) is not a power supply voltage of this circuit and does not depend on voltage V1. For example, voltage V2 (or VrefH) can then be delivered by a bandgap circuit which is, for example, powered with a power supply voltage which is not turned off when power supply V1 is turned off and/or which ends its ramping up before voltage V1 is turned on.

Thus, as soon as voltage V1 is turned on and is then at a zero value, transistor MN1 is in the off state, just as transistor MN3. By capacitive coupling between the source and the gate of transistor MN1, either via the parasitic source-gate capacitance of transistor MN1, or via capacitive element Cc, the gate of transistor MP3 receives a zero or nearly zero voltage, and transistor MP3 thus switches to the on state. As a result, inverter INV3 receives on its input a voltage substantially equal to voltage V2, and signal POR2000 is then in the low state corresponding to a zero or nearly zero voltage.

Advantageously, as soon as voltage V1 is turned on, signal POR2000 is in a defined state, that is, the low state.

Further, since the voltage on the drain of transistor MP3 is equal to voltage V2 minus the voltage drops across resistive element 2010 and transistor MP3, transistor MN2 is on and the gate of transistor MP3 receives zero voltage V1, which enables to keep transistor MP3 on.

Then, during the ramping up of voltage V1, as long as voltage V1 is too low to switch transistor MN2 to the off state, the gate voltage of transistor MP3 follows the increase of voltage V1. At the same time, as soon as voltage V1 becomes sufficient for transistor MN1 to switch to the on state and for transistor MN3 to switch to the on state, on the one hand, the voltage on the gate of transistor MP3 then becomes equal to the voltage V2 minus the voltage drops across resistive element 2008 and across transistor MN1, and, on the other hand, the voltage on the gate of transistor MN2 is drawn towards potential GND. As a result, on the one hand, transistor MP3 switches to the off state and, on the other hand, transistor MN2 switches to the off state. Further, due to the fact that inverter INV3 receives on its input a zero or nearly zero voltage, signal POR2000 then is in its high state corresponding to a voltage approximately equal to voltage V2 at its nominal value.

According to an embodiment corresponding to the above-described operation, transistor MP3 is configured to turn off when transistor MN1 turns on, to decrease the static power consumption of circuit 2000. Resistive elements 2008 and 2010 and transistors MN1 and MP3 are then sized in such a way that transistor MP3 turns off when transistor MN1 turns on. For example, when elements 2008 and 2010, for example the two transistors MP1 and MP2, are identical, transistor MP3 is sized so as to have, in absolute value, a threshold voltage value greater than that of transistor MN1. To achieve this, it is for example provided for the channel of transistor MP3 to be longer than that of transistors MN1, MN2, and MN3 when resistive elements MP1 and MP2 are identical.

According to a more power-consuming alternative embodiment, during the ramping up of voltage V1, or even at the end of this ramping up, transistor MP3 may remain on while transistors MN1 and MN3 are on. However, even if both transistors MN3 and MP3 are simultaneously on, due to the voltage drop across resistive element 2010, the input of inverter INV3 will receive a voltage closer to a zero value than to the nominal value of voltage V2, and signal POR2000 will then be in its high state.

There is considered as an example a case where:

voltage V1 corresponds to one of the power supply voltages of a circuit to be powered, to which a reset signal in a defined state is to be delivered as soon as one of its power supply voltages is turned on, and voltage V2 is a reference voltage VrefH having a non-zero value, preferably its nominal value, prior to the turning on and the ramping up of each of the power supply voltages of the circuit to be powered. In such a case, circuit 2000 can only monitor a single one of the power supply voltages of the circuit to be powered. To monitor all the power supply voltages of the circuit to be powered, and to provide it with a reset signal PORres in a binary state, for example low, defined as soon as one of these power supply voltages is turned on, and in another binary state, for example high, as soon as all these power supply voltages have ended their ramping up, a turn-on reset device comprising a plurality of circuits 2000 is provided, an example of embodiment of which will now be described in relation with FIG. 3.

Figure 3:
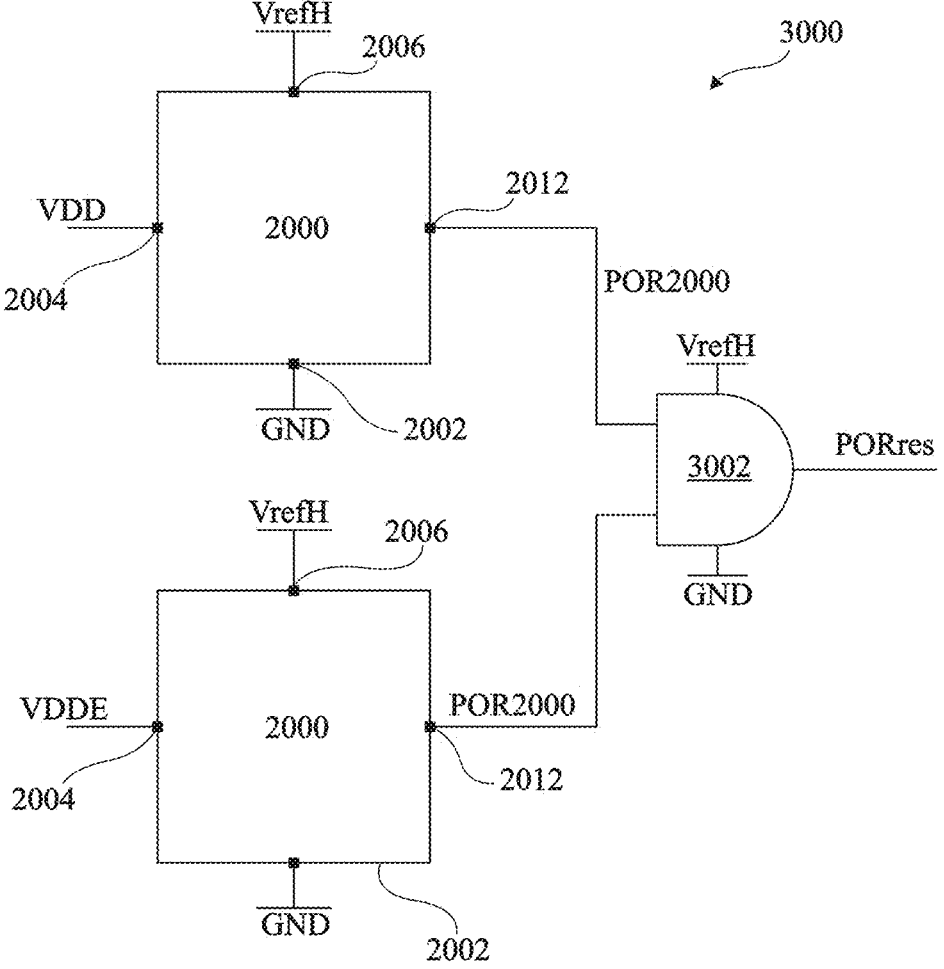
FIG. 3 shows an embodiment of a power-on reset device.

FIG. 3 shows an embodiment of a power-on reset device 3000.

In this example, device 3000 is configured to monitor the two power supply voltages VDD and VDDE of a circuit to be powered with these two power supply voltages, and to deliver, to this circuit to be powered, a power-on reset signal PORres which: is in the low state as soon as any of the monitored voltages VDDE and VDD is on and takes a zero value, and is in the high state as soon as all the monitored voltages VDDE and VDD have completed their ramping up.

Device 3000 comprises as many circuits 2000 as it monitors power supply voltages. Thus, in this example where device 3000 monitors the two voltages VDD and VDDE, circuit 3000 comprises two circuits 2000. However, those skilled in the art are capable of adapting the description made for the case where device 3000 only monitors the two voltages VDD and VDDE to the case where device 3000 monitors more than three power supply voltages.

The nodes, or inputs, 2006 of circuits 2000 all receive the same DC reference voltage VrefH.

The nodes 2002 of circuits 2000 all receive the same reference potential GND.

However, the nodes, or inputs, 2004 of circuits 2000 each receive a power supply voltage to be monitored, which forms part of the power supply voltages monitored by device 3000 and which is different from the power supply voltages to be monitored received by the nodes 2004 of the other circuits 2000. Thus, in this example where device 3000 monitors both voltages VDD and VDDE, one of the two circuits 2000 (at the top in FIG. 3) receives voltage VDD on its node 2004, and the other of the two circuits 2000 (at the bottom in FIG. 3) receives voltage VDDE on its node 2004.

Further, device 3000 comprises a logic gate 3002 implemented in CMOS technology and powered with reference voltage VrefH. More specifically, logic gate 3002 implements a Boolean AND logic function between the signals POR2000 delivered by circuits 2000. In the example of FIG. 3, gate 3002 thus comprises two inputs receiving signals POR2000 from the two circuits 2000. The output of gate 3002 delivers power-on reset signal PORres, which will be delivered to the circuit to be powered with the voltages VDD and VDDE monitored by device 3000.

As an example, not shown, logic gate 3002 comprises, to implement the AND function:

PMOS transistors assembled in parallel between a node at voltage VrefH and an intermediate node of gate 3002, and each having a gate connected to a corresponding input of the gate;

NMOS transistors assembled in series between the intermediate node and a node at potential GND, and each having a gate connected to a corresponding input of the gate; and an inverter powered with voltage VrefH, having an input connected to the intermediate node and an output corresponding to the output of the gate.

Although this is not shown, according to an embodiment, device 3000 comprises a reference voltage generation circuit configured to deliver reference voltage VrefH.

According to an embodiment, the reference voltage generation circuit is configured to deliver DC reference voltage VrefH at its nominal value prior to a powering on and a ramping up of each of the voltages VDD and VDDE monitored by device 3000. For example, the reference voltage generation circuit is a bandgap circuit.

Thus, as soon as one of voltages VDDE and VDD is powered on (or turned on), even if this voltage has a zero value and the other of voltages VDDE and VDD is in a high-impedance state, due to the fact that voltage VrefH is delivered to circuits 2000, the circuit 2000 receiving on its node 2004 the voltage which has just been turned on will deliver a signal in the low state. The low state of at least one signal POR2000 results in that signal PORres will be in the low state. Then, as long as all voltages VDDE and VDD have not completed their ramping up, signal PORres remains in its low state. Finally, once all the monitored voltages VDD and VDDE have completed their ramping up, signals POR2000 all are in their high state, whereby signal PORres is in the high state.

Device 3000 thus enables to monitor voltages VDDE and VDD and to deliver a turn-on reset signal PORres which is in a defined low state as soon as one of voltages VDDE and VDD is turned on, and which then switches to its high state only when all the monitored voltages VDD and VDDE have completed their ramping up, which was not the case with the circuit 1000 of FIG. 1. Signal PORres is thus independent from the sequence according to which the monitored voltages are turned on and ramped up.

In another embodiment, the circuit to be powered with voltages VDDE and VDD comprises cascode structures, each being powered with voltage VDDE, and each comprising a transistor having its gate biased by voltage VrefH and a transistor having its gate controlled by a binary signal. In this case, the circuit for generating voltage VrefH is configured so that voltage VrefH allows an implementation of the cascode structures with transistors having a breakdown voltage Vmax lower than values that the difference between the voltages VDDE and VDD can assume, while the turn-on sequence of voltages VDDE and VDD is not imposed. In this other embodiment, the bias voltage VrefH of the cascode structures may advantageously be used as the voltage VrefH for the previously-described circuits 2000.

Embodiments and variants of such a reference voltage generation circuit have been described in French patent application FR2304777 filed on May 15, 2023, and will be described hereafter in relation with FIGS. 4 to 10 corresponding to the respective FIGS. 1 to 7 of the above-mentioned application.

There appears from the above examples that, preferably, the device comprises a voltage generation circuit configured to deliver voltage V2, so that voltage V2 is non-zero before a powering on and a ramping up of voltage V1. First examples have been described in which, when voltage V1 is powered on and ramped up, voltage V2 already is at its nominal value, that is, for example, the ramping up of voltage V2 is complete. Further, second examples have been described in which, when voltage V1 is powered on and ramped up, voltage V2 is at a non-zero value, which may be different from its nominal value, for example, when voltage V2 has not completed its ramping up as voltage V1 starts its ramping up. In these second examples, voltage V2 may depend on a power supply voltage, for example VDDE, the ramping up of which is not complete when voltage V1 begins its ramping up. Thus, in these second examples, when voltage V1 begins its ramping up, voltage V2 may have a non-zero value which varies with that of the power supply voltage on which it depends, until voltage V2 reaches its nominal value. In these second examples, voltage V2 is, for example, delivered by the circuit of FIGS. 4 to 10 described hereafter.

Preferably, when voltage V1 is powered on and begins its ramping up, voltage V2 has a non-zero value, nominal or not, adapted to allowing the switching of transistor MP3 to the on state from the turning on of voltage V1 and the beginning of its ramping up, so that the signal on the drain of transistor MP3 is in a given state from the beginning of this ramping up of voltage V1. Preferably, when voltage V1 is powered on and begins its ramping up, the non-zero value of voltage V2 is further adapted to allowing the operation of inverter INV3 so that signal POR2000 is in a defined state and not in a high-impedance state, for example adapted to allowing the operation of inverters INV3 and INV4 so that signals POR2000 and nPOR200 are in defined states and not in high-impedance states.

Figure 4:
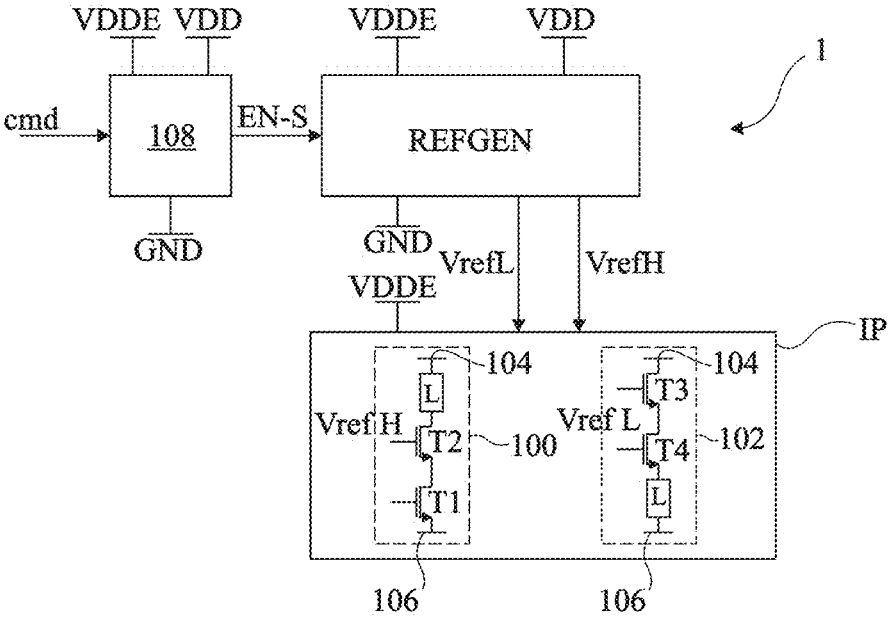
FIG. 4 shows, schematically and in the form of blocks, an example of an electronic system comprising a reference voltage generation circuit according to an embodiment.

FIG. 4 shows, schematically and in the form of blocks, an example of an electronic system 1 comprising a reference voltage generation device REFGEN according to an embodiment.

More particularly, system 1, corresponding for example to a portion of an integrated circuit chip, comprises an IP device, for example a resistive memory, and device REFGEN.

The IP device is powered with power supply voltage VDDE, for example available on a connection pad of the chip. As an example, voltage VDDE has a nominal value substantially equal to 3.3 V. The IP device comprises a terminal configured to receive voltage VDDE, and another terminal configured to receive reference potential GND, for example the ground, having voltage VDDE referenced thereto.

The IP device comprises MOS transistor cascode structures. For example, the IP device comprises N-channel MOS transistor cascode structures 100 and/or P-channel MOS transistor cascode structures 102.

As an example, each structure 100 comprises two N-channel MOS transistors T1 and T2 connected in series between a node 104 receiving voltage VDDE and a node 106 receiving potential GND. Transistor T1 has its source connected to node 106 and its drain connected to the source of transistor T2, the source of transistor T2 being coupled to node 104 by a load L. The gate of transistor T2 is configured to receive reference or bias voltage VrefH. Transistor T2 is, for example, called a cascode transistor. The gate of transistor T1 is configured to receive a control voltage in the range from 0 V to bias voltage VrefH.

Symmetrically, as an example, each structure 102 comprises two P-channel MOS transistors T3 and T4 connected in series between nodes 104 and 106. Transistor T2 has its source connected to node 104 and its drain connected to the source of transistor T2, the source of transistor T2 being coupled to node 106 by a load L. The gate of transistor T4 is configured to receive a reference voltage VrefL. Transistor T4 is, for example, a cascode transistor. The gate of transistor T3 is configured to receive a control voltage between reference voltage VrefL and power supply voltage VDDE.

In the rest of the disclosure, there is called Vmax the maximum voltage that can be applied between the gate and the source or between source and the drain of each of the transistors of the IP device without for this to damage the transistor. In other words, Vmax is the breakdown voltage of the MOS transistors of the IP device.

Preferably, voltages VrefL and VrefH have different values. For example, to optimize the operation of the N-channel and P-channel transistors of the IP device, voltage VrefL is selected to be equal to voltage VDEE minus voltage VrefH. However, in other examples, voltages VrefL and VrefH have the same value.

Voltages VrefH and VrefL are received by the IP device.

Device REFGEN is configured to deliver voltages VrefL and VrefH. Device REFGEN is powered with voltage VDDE. Device REFGEN has, for example, a terminal receiving voltage VDDE, and another terminal receiving reference potential GND.

According to an embodiment, device REFGEN is further configured to receive a power supply voltage VDD and a binary signal EN-S.

Voltage VDD has a nominal value lower than that of voltage VDDE. In particular, voltage VDD is lower than breakdown voltage Vmax. For example, the result of the subtraction of the nominal value of voltage VDD from that of voltage VDDE is lower than the breakdown voltage of the transistors T1, T2, T3, and T4 of the IP device. As an example, voltage VDD is a voltage generated by a circuit (not shown) of the integrated circuit chip comprising system 1.

Signal EN-S is a binary signal having its low level corresponding to a zero voltage, and having its high level corresponding to voltage VDD. Signal EN-S is configured to be, by default, at its low level. Signal EN-S is further configured to be at its low level when the current value of voltage VDDE is greater than voltage Vmax. When the current value of voltage VDDE is lower than voltage Vmax, the level of signal EN-S is determined by a control signal cmd. For example, the levelling of signal EN-S with signal cmd when voltage VDDE is lower than voltage Vmax corresponds to a low-power operating mode where voltage VDDE is at a current value lower than its nominal value, for example a current value equal to the nominal value of voltage VDD.

As an example, system 1 comprises a circuit 108 configured to receive voltages VDDE and VDD, potential GND, and signal cmd, and to deliver signal EN-S. The implementation of such a circuit 108, and more generally the generation of signal EN-S, are within the abilities of those skilled in the art.

According to an embodiment, circuit REFGEN does not receive signal EN-S and voltage VDD.

In the example of FIG. 4, the IP device comprises structures 100 and 102, and device REFGEN thus delivers the two voltages VrefH and VrefL. In other examples, the IP device comprises no structure 100 and device REFGEN then only delivers voltage VrefL, or, conversely, the IP device comprises no structure 102 and device REFGEN then only delivers voltage VrefH.

Figure 5:
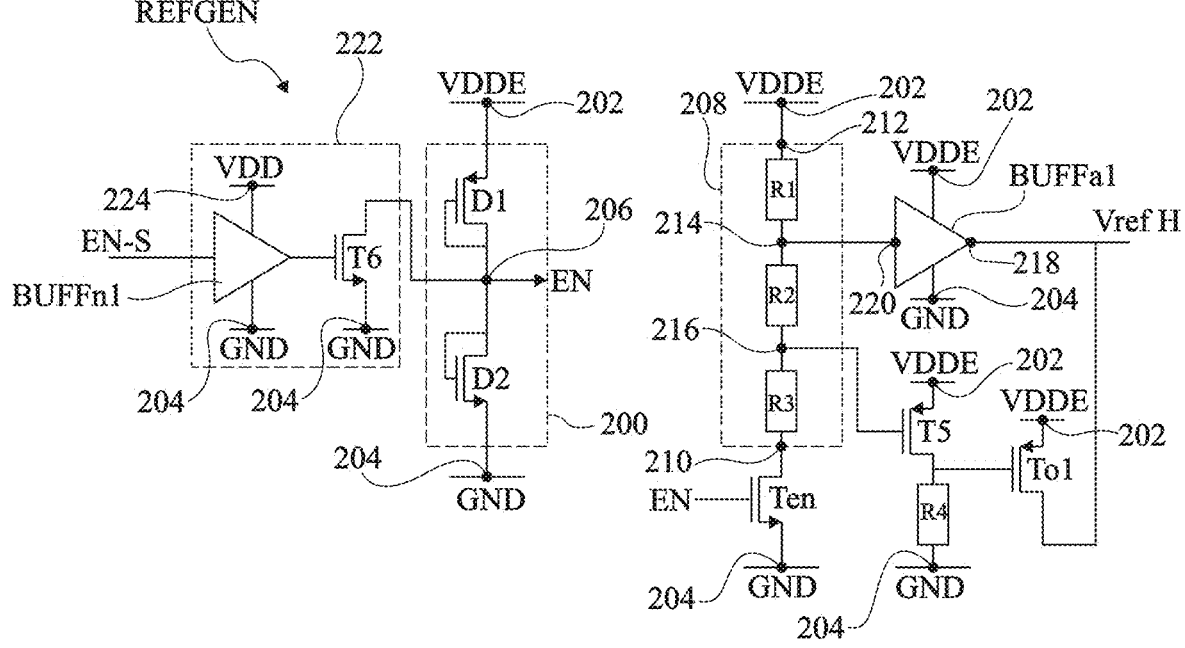
FIG. 5 illustrates, in the form of a circuit, an embodiment of the reference voltage generation circuit of FIG. 4.

FIG. 5 illustrates, in the form of a circuit, an embodiment of the circuit REFGEN of FIG. 4. In this embodiment, device REFGEN is configured to only deliver voltage VrefH.

According to an embodiment, this device REFGEN delivers voltage VrefH to each previously-described circuit 2000 and forms part of device 3000. Further, device REFGEN may be used to deliver voltage VrefH to the previously-described circuits 2000 whether or not it is used to deliver voltage VrefH to circuit IP.

Device REFGEN comprises a voltage dividing bridge 200. Bridge 200 is connected between a node 202 configured to receive voltage VDDE, and a node 204 configured to receive potential GND. For example, bridge 200 has one end connected to node 202 and one end connected to node 204.

According to an embodiment, bridge 200 comprises one or a plurality of P-channel MOS transistors connected in series between node 202 and an intermediate node 206 of bridge 200. Each of these P-channel transistors is diode-assembled, or, in other words, has its drain connected to its gate. Each of these P-channel transistors has its source on the side of node 202. In FIG. 5, these P-channel transistors are shown in the form of a single P-channel MOS transistor, D1. Symmetrically, bridge 200 comprises one or a plurality of N-channel MOS transistors connected in series between node 206 and node 204. Each of these N-channel transistors is diode-assembled, or, in other words, has its drain connected to its gate. Each of these N-channel transistors has its source on the side of node 204. In FIG. 5, these N-channel transistors are shown in the form of a single N-channel MOS transistor, D2.

According to an alternative embodiment, the P-channel MOS transistors of bridge 200 are replaced with diodes, for example diodes having their anodes on the side of node 202, and the N-channel MOS transistors of bridge 200 are also replaced with diodes, for example diodes having their anodes on the side of node 206.

According to another alternative embodiment, the P-channel transistors of bridge 200 are replaced with a resistive element comprising one or a plurality of resistors in series between nodes 202 and 206, and the N-channel transistors of bridge 200 are replaced with another resistive element comprising one or a plurality of resistors in series between nodes 206 and 204.

Device REFGEN comprises an MOS transistor Ten and a resistive voltage dividing bridge 208, transistor Ten and bridge 208 being connected in series between nodes 202 and 204.

Transistor Ten has its gate connected to node 206, at which a voltage EN is available. The source of transistor Ten is connected to node 204 in the embodiment of FIG. 5. In the embodiment of FIG. 5, transistor Ten has an N channel.

Dividing bridge 208 has an end 210 connected to the drain of transistor Ten. Dividing bridge 208 has another end 212 connected to node 202 in the embodiment of FIG. 5.

Bridge 208 comprises, for example, at least three resistive elements R1, R2, and R3. Each resistive element R1, R2, R3 of bridge 208 may correspond to a single resistor or to a series and/or parallel combination of a plurality of resistors. As an example, element R1 is connected between end 212 and an intermediate node 214 of bridge 208, element R2 is connected between node 214 and another intermediate node 216 of bridge 208, and element R3 is connected between node 216 and the end 210 of bridge.

Device REFGEN comprises a buffer circuit BUFFa1. Circuit BUFFa1 is powered with voltage VDDE. For example, circuit BUFFa1 has one terminal connected to node 202 and one terminal connected to node 204.

Circuit BUFFa1 is an analog buffer circuit. In other words, circuit BUFFa1 is configured to deliver on its output 218 a voltage having a value identical to that of a voltage that it receives on its input 220, while providing an insulation between its input and its output. Still in other words, circuit BUFFa1 is a unity-gain follower circuit.

The input 218 of circuit BUFFa1 is connected to an intermediate node of bridge 208, for example to node 214. The output 220 of circuit BUFFa1 delivers voltage VrefH.

Device REFGEN further comprises a MOS transistor To1. The drain of transistor To1 is connected to the output of circuit BUFFa1. The source of transistor To1 is connected to node 202 in the embodiment of FIG. 5 where device REFGEN is configured to deliver voltage VrefH. In the embodiment of FIG. 5, transistor To1 has a P channel.

Transistor To1 is configured to be in the on state when transistor Ten is in the off state, and to be in the off state when transistor Ten is in the on state. More particularly, transistor To1 is configured so that it's on or off state is determined by a voltage value on an intermediate node of dividing bridge 208, for example on node 216 of bridge 208.

In the example of FIG. 5, device REFGEN comprises a P-channel MOS transistor T5 and a resistive element R4 in series between nodes 202 and 204. Transistor T5 has its gate connected to node 216 of bridge 208, its source connected to the same node 202 as the source of transistor To1, and its drain coupled to node 204 by element R4. The gate of transistor To1 is connected to the drain of transistor T5.

In circuit REFGEN, dividing bridge 200 is configured so that transistor Ten is in the off state if voltage VDDE is lower than a threshold VT1, for example substantially equal to 0.9 V. Preferably, threshold VT1 is lower than voltage Vmax. Conversely, dividing bridge 200 is configured so that transistor Ten is on if voltage VDDE is greater than threshold VT1. More particularly, dividing bridge 200 is configured to have the above operation when it is taken alone, that is, when no circuit directly modifies the potential of node 206, for example by drawing this node 206 to GND or VDDE.

Thus, when bridge 200 is taken alone and voltage VDDE is lower than threshold VT1, voltage EN is lower than the threshold of transistor Ten, which is then in the off state. As a result, node 216 is at voltage VDDE, and thus transistor T5 is in the off state. The off state of transistor T5 results in that the gate of transistor To1 receives potential GND, and thus that transistor To1 is in the on state. Output 218, and thus voltage VrefH, is then drawn to voltage VDDE. In other words, as long as voltage VDDE is lower than threshold VT1, voltage VrefH follows voltage VDDE. Conversely, when bridge 200 is taken alone and voltage VDDE is greater than or equal to threshold VT1, voltage EN is sufficient for transistor Ten to be on, whereby transistor T5 turns on, this on state of transistor T5 forcing transistor To1 to the off state. Voltage VrefH is then equal to the voltage on input 220 of circuit BUFFa1. As an example, dividing bridge 208 is configured so that, when transistor Ten is on, the voltage at input 220 of circuit BUFFa1 is equal to 0.55 times voltage VDDE when the output 218 of circuit BUFFa1 delivers voltage VrefH.

In an embodiment (not shown), circuit REFGEN does not receive signal EN-S and voltage VDD.

In another embodiment, as illustrated in FIG. 5, device REFGEN receives signal EN-S and voltage VDD. Device REFGEN then comprises a circuit 222 configured to receive signal EN-S and to draw, only when signal EN-S is at its high level, node 206 to that of potential GND and of voltage VDDE which sets transistor Ten to the off state when it is applied to the transistor gate. In the embodiment of FIG. 5, where transistor Ten has an N channel and has its source connected to node 204, circuit 222 is configured to draw node 206 to node 204 when signal EN-S is at its high level.

When voltage VDDE is lower than Vmax and signal cmd controls the high level of signal EN-S, the provision of circuit 222 enables voltage VrefH to be equal to the voltage of node 202 having the source of transistor To1 connected thereto. As an example, such an operation enables that, in a low-power mode where voltage VDDE is at a low value as compared with its nominal value and lower than the voltage Vmax, for example a low value equal to the nominal value of voltage VDD, voltage VrefH is at a value allowing the operation of the cascode structures 100 of the IP device (FIG. 4).

In the embodiment of FIG. 5, circuit 222 comprises a buffer circuit BUFFn1 and an N-channel MOS transistor T6. Circuit BUFFn1 is powered with voltage VDD. For example, circuit BUFFn1 has one terminal connected to node 204 and one terminal connected to a node 224 configured to receive voltage VDD.

Circuit BUFFn1 is a digital buffer circuit. Circuit BUFFn1 is thus configured to deliver on its output 226 a digital signal at the high level (VDD) when its input 228 receives the high level of signal EN-S, and at the low level (GND) when its input receives the low level (GND) of signal EN-S, while ensuring an insulation between its input and its output. As an example, circuit BUFFn1 comprises two inverters in series between its input 228 and its output 226.

Transistor T6 has its source connected to node 204, its gate connected to the output 226 of circuit BUFFn1, and its drain connected to node 206 of bridge 200.

There has been described hereabove in relation with FIG. 5 an embodiment in which device REFGEN is configured to deliver voltage VrefH, which implies that transistor To1 has its source connected to node 202.

In an alternative implementation (not illustrated) of device REFGEN, the device described in relation with FIG. 5 is configured to generate voltage VrefL and is then not used to deliver voltage VrefH to circuits 2000. In this variant, transistor To1 has an N channel, and has its source connected to node 204. In such a variant, transistor To1 remains controlled from a voltage on an intermediate node of bridge 208, for example on node 216, so as to be on when transistor Ten is off, and to be off when transistor Ten is on. In such a variant, the gate of transistor To1 is, for example, connected to node 216, and transistor T5 and resistive element R4 may be omitted. In such a variant, voltage VrefL is then delivered on the output of circuit BUFFa1 instead of voltage VrefH, voltage VrefL being zero as long as transistor Ten is off and equal to the voltage at node 214 when transistor Ten is on. As an example, when the output 218 of circuit BUFFa1 delivers voltage VrefL, bridge 208 is configured so that the voltage on node 214 is equal to 0.45 times voltage VDDE when transistor Ten is on.

The device REFGEN described in relation with FIG. 5 has the advantage of being able to be implemented with MOS transistors similar to those of the IP device, that is, of MOS transistors having a breakdown voltage Vmax. Further, by using voltage VrefH as the voltage applied to node 2006 of circuits 2000, the latter may also be implemented with MOS transistors having a breakdown voltage Vmax.

Figure 6:
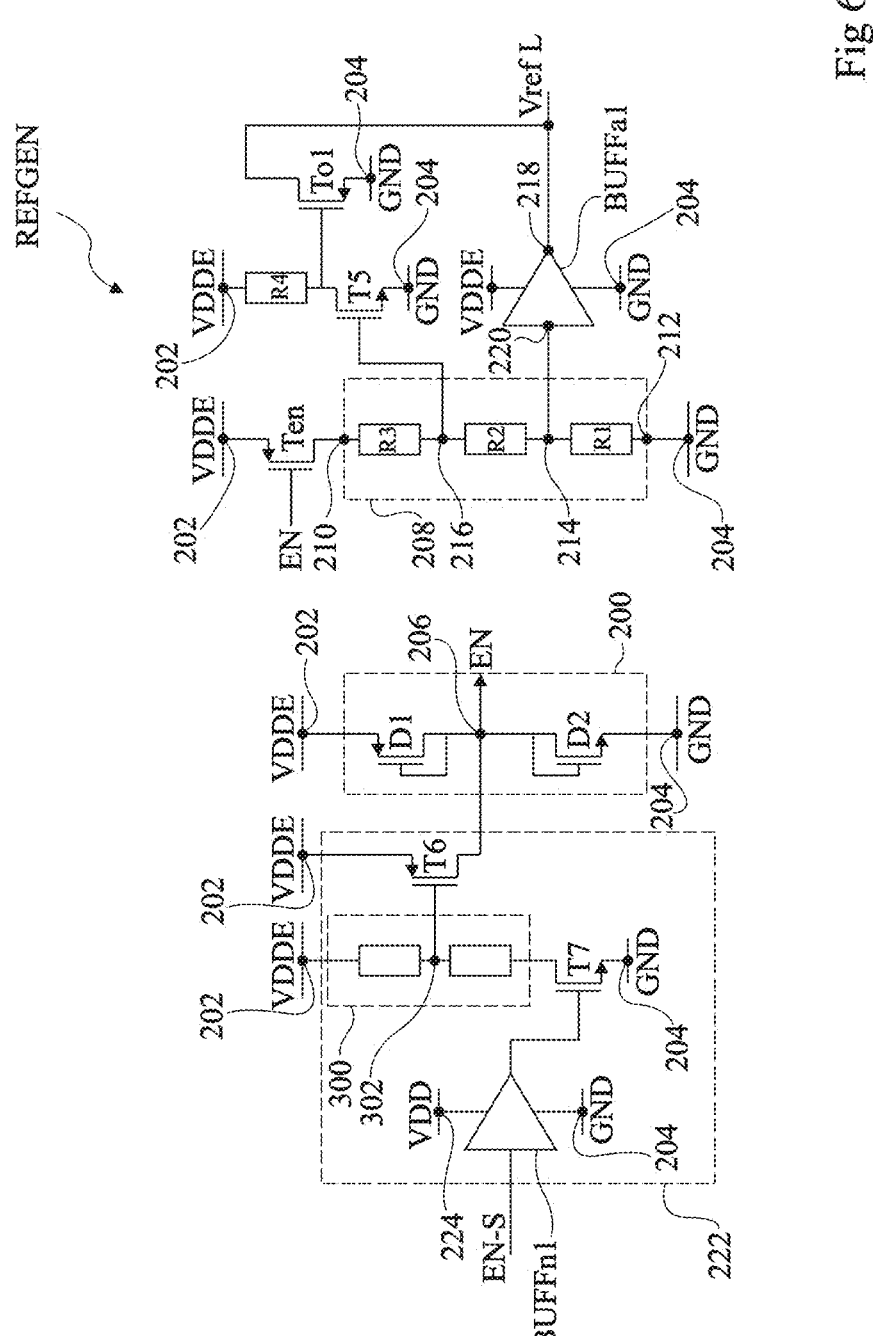
FIG. 6 illustrates, in the form of a circuit, an example of the reference voltage generation circuit of FIG. 4.

FIG. 6 illustrates, in the form of a circuit, another example of embodiment of the circuit REFGEN of FIG. 4. In this example of embodiment, device REFGEN is configured to only deliver voltage VrefL, and is thus not used to deliver voltage VrefH to circuits 2000.

The device REFGEN of FIG. 6 comprises many elements in common with that of FIG. 5, and only the differences between these two devices are here highlighted. In particular, unless otherwise indicated, all that has been indicated for the device REFGEN described in relation with FIG. 5 applies to the device REFGEN of FIG. 6.

Device REFGEN comprises voltage dividing bridge 200, resistive voltage dividing bridge 208, buffer circuit BUFFa1, transistor Ten, and transistor To1.

Transistor Ten and bridge 208 are connected in series between nodes 202 and 204. However, unlike what has been described in relation with FIG. 5, in FIG. 6, transistor Ten has a P channel and has its source connected to node 202, the end 212 of dividing bridge 208 thus being connected to node 204.

Further, in the embodiment shown in FIG. 6, the output 218 of buffer circuit BUFFa1 delivers voltage VrefL and not voltage VrefH as in FIG. 5. The input 218 of circuit BUFFa1 is connected to an intermediate node of bridge 208, for example to node 214.

In the embodiment of FIG. 6, where device REFGEN is configured to deliver voltage VrefL, the source of transistor To1 is connected to node 204 and transistor To1 has an N channel. As in FIG. 5, in the device REFGEN of FIG. 6, transistor To1 is configured to be in the on state when transistor Ten is in the off state, and to be in the off state when transistor Ten is in the on state. More particularly, transistor To1 is configured so that its on or off state is determined by a voltage value on an intermediate node of dividing bridge 208, for example on node 216 of bridge 208.

In the example of FIG. 6, device REFGEN comprises MOS transistor T5 and resistive element R4 in series between nodes 202 and 204. However, as compared with what has been described in relation with FIG. 5, in FIG. 6, transistor T5 has an N channel and has its source connected to node 204.

As in FIG. 5, in FIG. 6, dividing bridge 200 is configured so that transistor Ten is in the off state if voltage VDDE is lower than a threshold VT1, for example substantially equal to 0.9 V, and so that transistor Ten is on if voltage VDDE is higher than threshold VT1. More particularly, dividing bridge 200 is configured to have the above operation when it is taken alone.

Thus, when bridge 200 is taken alone and voltage VDDE is lower than threshold VT1, the difference between voltages EN and VDDE is not sufficient for transistor Ten to be on. The off state of transistor Ten implies that node 216 is at potential GND, whereby transistor T5 is in the off state and the gate of transistor To1 receives voltage VDDE. Transistor To1 is then in the on state and voltage VrefL is zero. Conversely, when bridge 200 is taken alone and voltage VDDE is greater than or equal to threshold VT1, the difference between voltages EN and VDDE is sufficient for transistor Ten to be on, whereby transistor T5 turns on, which sets transistor To1 to the off state. Voltage VrefL is then equal to the voltage on the input 220 of circuit BUFFa1. As an example, when the output 218 of circuit BUFFa1 delivers voltage VrefL, bridge 208 is configured so that the voltage on node 214 is equal to 0.45 times voltage VDDE when transistor Ten is on.

In an embodiment (not illustrated), circuit REFGEN does not receive signal EN-S and voltage VDD.

In another embodiment, as illustrated in FIG. 6, device REFGEN receives signal EN-S and voltage VDD. Device REFGEN then comprises circuit 222 configured to receive signal EN-S and to draw, when signal EN-S is at its high level, node 206 to that of potential GND and of voltage VDDE, which controls the off state of transistor Ten. Thus, in the embodiment of FIG. 6 where transistor Ten has a P channel and has its source connected to node 202, circuit 222 is configured to draw node 206 to node 202 when signal EN-S is at its high level.

When the current value of voltage VDDE is lower than Vmax and signal cmd controls the high level of signal EN-S, the provision of circuit 222 enables voltage VrefL to be equal to the voltage of node 204 having the source of transistor To1 connected thereto. As an example, in a low-power mode where voltage VDDE is at a low value as compared with its nominal value and lower than voltage Vmax, voltage VrefL is at a value allowing the operation of the cascode structures 102 of the IP device (FIG. 4).

In the embodiment of FIG. 6, circuit 222 comprises buffer circuit BUFFn1 and MOS transistor T6. However, in this example, transistor T6 has a P channel and has its source connected to node 202, and its gate is not connected to the output of circuit BUFFn1. Circuit 222 then further comprises an N-channel MOS transistor T7 and a voltage dividing bridge 300 connected in series between nodes 202 and 204. Bridge 300, preferably a resistive dividing bridge, is connected between node 202 and transistor T7. Transistor T7 has its source connected to node 204, its gate connected to the output of circuit BUFFn1, and its drain connected to bridge 300. The gate of transistor T6 is connected to an intermediate node 302 of bridge 300.

In the implementation described herein of circuit 222, when voltage VDDE is higher than voltage Vmax and signal EN-S thus is at its low level, transistor T7 then has a zero gate-source voltage but a drain-source voltage equal to the VDDE and thus higher than breakdown voltage Vmax of the transistors of the IP device. Thus, transistor T7 is selected to be able to withstand voltage VDDE on its drain. For example, transistor T7 is an extended-drain transistor.

The device REFGEN described in relation with FIG. 6 has the advantage of being able to be implemented with MOS transistors similar to those of the IP device, that is, MOS transistors having a breakdown voltage Vmax, except as concerns transistor T7, which is sized to be able to withstand voltage VDDE on its drain.

There has been described hereabove in relation with FIG. 6 an embodiment in which device REFGEN is configured to deliver voltage VrefL, which implies that transistor To1 has its source connected to node 204.

In an alternative embodiment, the device described in relation with FIG. 6 is configured to generate voltage VrefH and may be used to deliver voltage VrefH to circuits 2000. In this case, transistor To1 has a P channel, and has its source connected to node 202. In such a variant, transistor To1 remains controlled from a voltage on an intermediate node of bridge 208, for example node 216, so as to be on when transistor Ten is off, and to be off when transistor Ten is on. In such a variant, the gate of transistor To1 is, for example, connected to node 216, and transistor T5 and resistive element R4 may be omitted. In such a variant, voltage VrefH is then delivered on the output of circuit BUFFa1 instead of voltage VrefL, voltage VrefH following voltage VDDE as long as transistor Ten is off and being equal to the voltage on node 214 when transistor Ten is on. As an example, when the output 218 of circuit BUFFa1 delivers voltage VrefH, bridge 208 is configured so that the voltage on node 214 is equal to 0.55 times voltage VDDE when transistor Ten is on.

According to an embodiment, this device REFGEN according to the variant described hereabove in relation with FIG. 6 delivers voltage VrefH to each previously-described circuit 2000 and forms part of device 3000. Further, device REFGEN may be used to deliver voltage VrefH to the previously-described circuits 2000 whether or not it is used to deliver voltage VrefH to the IP circuit.

Figure 7:
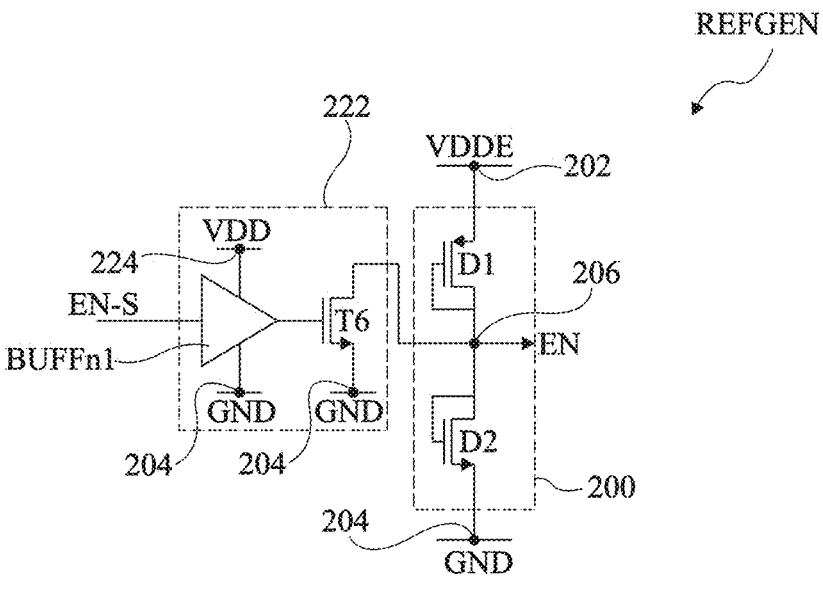
FIG. 7 shows, in the form of a circuit, an alternative embodiment of the circuit of FIG. 5.
Figure 7:
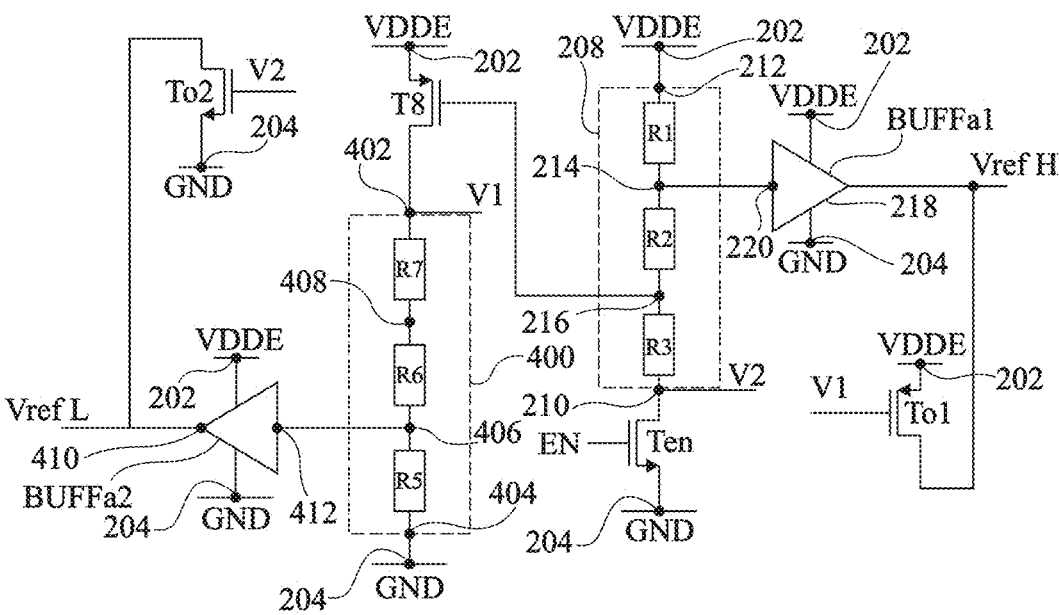

FIG. 7 shows, in the form of a circuit, an alternative embodiment of the circuit REFGEN of FIG. 5. As compared with the circuit REFGEN of FIG. 5, which is configured to deliver voltage VrefH, the circuit REFGEN of FIG. 7 is configured to generate voltage VrefH and voltage VrefL.

According to an embodiment, this device REFGEN delivers voltage VrefH to each previously-described circuit 2000 and forms part of device 3000. Further, device REFGEN may be used to deliver voltage VrefH to the previously-described circuits 2000, whether or not it is used to deliver voltage VrefH to the IP circuit.

The device REFGEN of FIG. 7 comprises many elements in common with that of FIG. 5, and only the differences between these two devices are here highlighted. In particular, unless otherwise indicated, all that has been indicated for the device REFGEN described in relation with FIG. 5 applies to the device REFGEN of FIG. 7.

As compared with the device REFGEN of FIG. 5, the device REFGEN of FIG. 7 further comprises a resistive voltage dividing bridge 400 and a MOS transistor T8 in series between nodes 202 and 204.

The source of transistor T8 is connected to that of nodes 202 and 204 to which the source of transistor Ten is not connected, that is, to node 202 in the embodiment of FIG. 7. In the embodiment of FIG. 7, transistor T8 has a P channel.

Transistor T8 is configured to be on, respectively off, when transistor Ten is on, respectively off. In the embodiment of FIG. 7, transistor T8 has its gate connected to an intermediate node of bridge 208, for example to node 216.

Dividing bridge 400 has an end 402 connected to the drain of transistor T8. Dividing bridge 400 has another end 404 connected to node 204 in the embodiment of FIG. 7.

Bridge 400 for example comprises at least three resistive elements R5, R6, and R7. Each resistive element R5, R6, R7 of bridge 400 may correspond to a single resistor or to a series and/or parallel association of a plurality of resistors. As an example, element R5 is connected between end 404 and an intermediate node 406 of bridge 400, element R6 is connected between node 406 and another intermediate node 408 of bridge 400, and element R7 is connected between node 408 and end 402 of bridge 400.

As compared with the device REFGEN of FIG. 5, the device REFGEN of FIG. 7 comprises a buffer circuit BUFFa2. Circuit BUFFa2 is powered with voltage VDDE. For example, circuit BUFFa2 has one terminal connected to node 202 and one terminal connected to node 204.

Circuit BUFFa2 is an analog buffer circuit. In other words, circuit BUFFa2 is configured to deliver on its output a voltage having a value identical to that of a voltage that it receives on its input 412, while ensuring an insulation between its input and its output. Still in other words, circuit BUFFa2 is a unity-gain follower circuit.

The input 412 of circuit BUFFa2 is connected to an intermediate node of bridge 400, for example to node 406. In the embodiment of FIG. 7, the output 410 of circuit BUFFa2 delivers voltage VrefL.

Device REFGEN further comprises a MOS transistor To2. The drain of transistor To2 is connected to the output of circuit BUFFa2. The source of transistor To2 is connected to node 204 in the embodiment of FIG. 7, where circuit BUFFa2 is configured to deliver voltage VrefL. In other words, the source of transistor To2 and the source of transistor To1 are connected to different respective nodes among nodes 202 and 204. In the embodiment of FIG. 7, transistor To2 has an N channel.

Transistor To2 is configured to be in the on state when transistor T8 is in the off state, and to be in the off state when transistor T8 is in the on state.

More particularly, in the embodiment of FIG. 7, transistor To2 is configured so that its on or off state is determined by a voltage value V2 on a node of dividing bridge 208, for example on node 210 of dividing bridge 300, and transistor To1 is configured so that its on or off state is determined by a voltage value V1 on a node of dividing bridge 400, for example on node 402 of bridge 400. Transistor To1 has its gate coupled, preferably connected, to node 402, transistor To2 having its gate coupled, preferably connected, to node 210.

In an alternative embodiment (not shown), device REFGEN comprises a MOS transistor and a resistive element in series between nodes 202 and 204, identical to the transistor T5 and to the element R4 of FIG. 5, and connected to each other, to bridge 208, and to transistor To1 in the same way as transistor T5 and element R4 in FIG. 5. Transistor To1 is then not controlled by the voltage V1 of bridge 400. As compared with the embodiment illustrated in FIG. 7, this variant is more bulky.

In another alternative embodiment, capable of being combined with the above alternative embodiment, device REFGEN comprises a MOS transistor and a resistive element in series between nodes 202 and 204, identical to the transistor T5 and to the element R4 of FIG. 6, and connected to each other, to bridge 208, and to transistor To1 in the same way as transistor T5 and element R4 in FIG. 6. Transistor To2 is then not controlled by the voltage V2 of bridge 208. As compared with the embodiment illustrated in FIG. 7, this variant is more bulky.

In the embodiment of FIG. 7, device REFGEN comprises the circuit 222 of FIG. 4.

In an alternative embodiment, circuit 222 is omitted.

The operation of the device REFGEN of FIG. 7 is within the abilities of those skilled in the art based on the above functional description of the devices REFGEN of FIGS. 5 and 6.

The device REFGEN described in relation with FIG. 7 has the advantage of being able to be implemented with MOS transistors similar to those of the IP device, that is, MOS transistors having a breakdown voltage Vmax. Further, circuits 2000 may then also be implemented with MOS transistors having a breakdown voltage Vmax.

Figure 8:
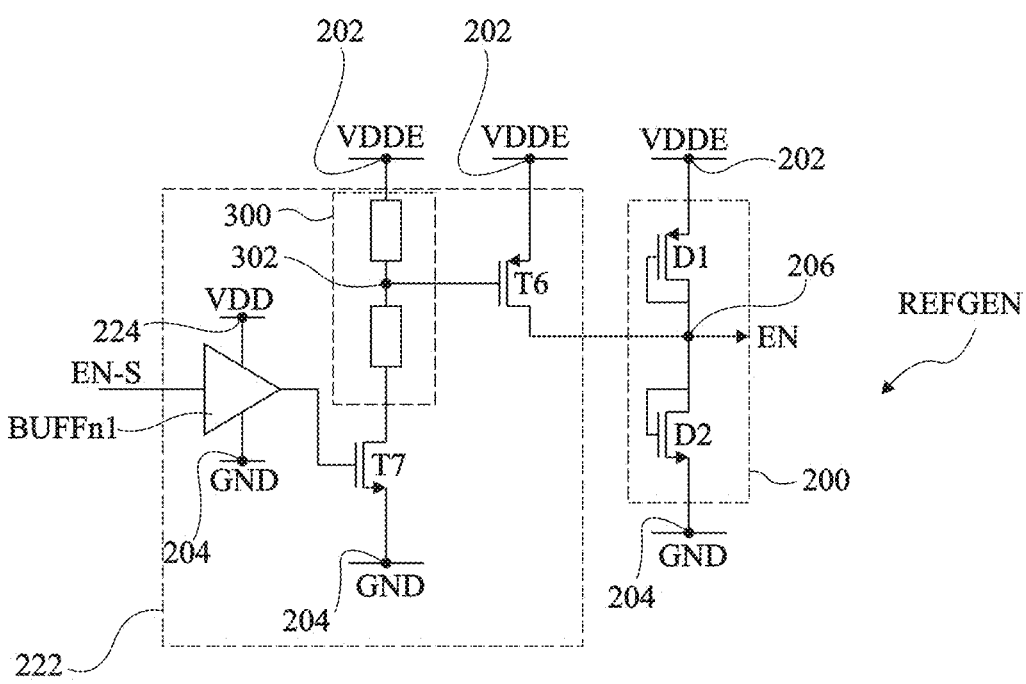
FIG. 8 shows, in the form of a circuit, an alternative embodiment of the circuit of FIG. 6.
Figure 8:
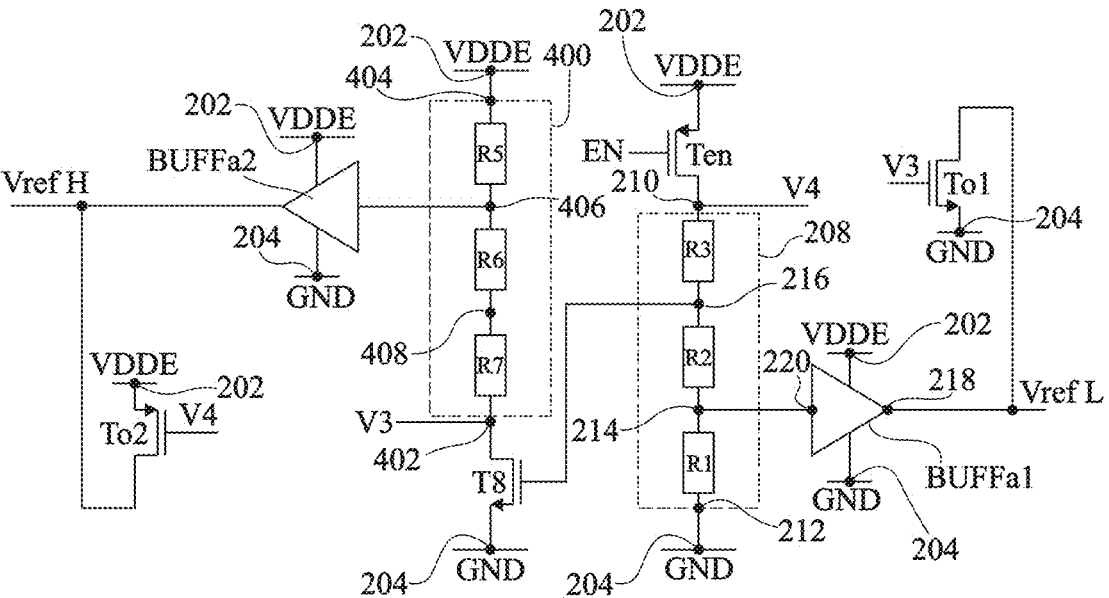

FIG. 8 shows, in the form of a circuit, an alternative embodiment of the circuit REFGEN of FIG. 6. As compared with the circuit REFGEN of FIG. 6, which is configured to deliver voltage VrefL, the circuit REFGEN of FIG. 8 is configured to generate voltage VrefL and voltage VrefH.

According to an embodiment, this device REFGEN delivers voltage VrefH to each previously-described circuit 2000 and forms part of device 3000. Further, device REFGEN may be used to deliver voltage VrefH to the previously-described circuits 2000 whether or not it is used to deliver voltage VrefH to the IP circuit.

The device REFGEN of FIG. 8 comprises many elements in common with that of FIG. 6, and only the differences between these two devices are here highlighted. In particular, unless otherwise indicated, all that has been indicated for the device REFGEN described in relation with FIG. 6 applies to the device REFGEN of FIG. 8. Further, since the device REFGEN of FIG. 8 comprises elements described in relation with the device REFGEN of FIG. 7, for these elements, only the differences between FIG. 7 and FIG. 8 are highlighted.

As compared with the device REFGEN of FIG. 6, the device REFGEN of FIG. 8 further comprises, like the device REFGEN of FIG. 7, resistive voltage dividing bridge 400 and a MOS transistor T8 in series between nodes 202 and 204.

The source of transistor T8 is connected to that of nodes 202 and 204 to which the source of transistor Ten is not connected, that is, to node 204 in the embodiment of FIG. 8. In the embodiment of FIG. 8, transistor T8 has an N channel.

Transistor T8 is configured to be on, respectively off, when transistor Ten is on, respectively off. In the embodiment of FIG. 8, transistor T8 has its gate connected to an intermediate node of bridge 208, for example to node 216.

Dividing bridge 400 has its end 404 connected to node 202 in the embodiment of FIG. 8.

As compared with the device REFGEN of FIG. 6, the device REFGEN of FIG. 8 comprises, like the circuit REFGEN of FIG. 7, buffer circuit BUFFa2. The input 412 of circuit BUFFa2 is connected to an intermediate node of bridge 400, for example to node 406. In the embodiment of FIG. 8, the output 410 of circuit BUFFa2 delivers voltage VrefH.

The device REFGEN of FIG. 8 further comprises, like the device REFGEN of FIG. 7, a MOS transistor. The source of transistor To2 is connected to node 202 in the embodiment of FIG. 8 where circuit BUFFa2 is configured to deliver voltage VrefH. In other words, the source of transistor To2 and the source of transistor To1 are connected to different respective nodes among nodes 202 and 204. In the embodiment of FIG. 8, transistor To2 has P channel.

More particularly, in the embodiment of FIG. 8, transistor To2 is configured so that its on or off state is determined by a voltage value V4 on a node of dividing bridge 208, for example on node 210 of dividing bridge 300, and transistor To1 is configured so that its on or off state is determined by a voltage value V3 on a node of dividing bridge 400, for example on node 402 of bridge 400. Transistor To1 has its gate coupled, preferably connected, to node 402, transistor To2 having its gate coupled, preferably connected, to node 210.

In an alternative embodiment (not illustrated), device REFGEN comprises a MOS transistor and a resistive element in series between nodes 202 and 204, identical to the transistor T5 and to the element R4 of FIG. 3, and connected to each other, to bridge 208 and to transistor To1 in the same way as transistor T5 and element R4 in FIG. 6. Transistor To1 is thus not controlled by the voltage V3 of bridge 400. As compared with the embodiment illustrated in FIG. 8, this variant is more bulky.

In another alternative embodiment, which may be combined with the above alternative embodiment, device REFGEN comprises a MOS transistor and a resistive element in series between nodes 202 and 204, identical to the transistor T5 and to the element R4 of FIG. 5, and connected to each other, to bridge 208, and to transistor To1 in the same way as transistor T5 and element R4 in FIG. 5. Transistor To2 is then not controlled by the voltage V4 of bridge 208. As compared with the embodiment illustrated in FIG. 8, this variant is more bulky.

In the embodiment of FIG. 8, device REFGEN comprises the circuit 222 of FIG. 6.

In an alternative embodiment, circuit 222 is omitted.

The operation of the device REFGEN of FIG. 8 is within the abilities of those skilled in the art based on the functional description previously made of the devices REFGEN of FIGS. 5 and 6.

The device REFGEN described in relation with FIG. 8 has the advantage of being able to be implemented with MOS transistors similar to those of the IP device, that is, MOS transistors having a breakdown voltage Vmax, except as concerns transistor T7, which is sized to be able to withstand voltage VDDE on its drain. Circuits 2000 may then also be implemented with MOS transistors having a breakdown voltage Vmax.

Figure 9:
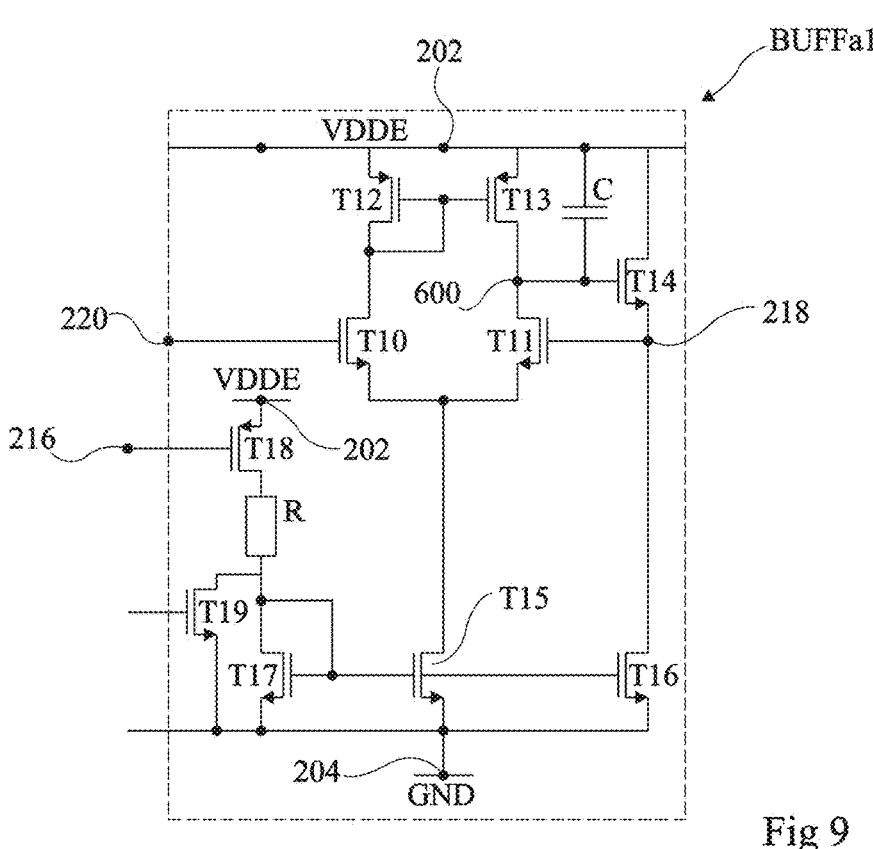
FIG. 9 shows, in the form of a circuit, an example of embodiment of an analog buffer circuit.

FIG. 9 shows, in the form of a circuit, an example of embodiment of an analog buffer circuit configured to deliver voltage VrefH. In this example, the described buffer circuit is the circuit BUFFa1 implemented in the circuit REFGEN of FIG. 7.

Circuit BUFFa1 comprises a differential pair comprising two MOS transistors T10 and T11. Since circuit BUFFa1 delivers voltage VrefH, transistors T10 and T11 preferably have an N channel.

Transistor T10 has its gate connected to input 220 of circuit BUFFa1, and thus receives, in this example, the voltage present on node 214 of bridge 208 (FIG. 7). Transistor T11 has its gate connected to the output 218 of circuit BUFFa1, and thus receives voltage VrefH.

Circuit BUFFa1 further comprises two MOS transistors T12 and T13 assembled as a current mirror with each other, and configured to bias the respective transistors T10 and T11 of the differential pair. Since circuit BUFFa1 delivers voltage VrefH, transistors T12 and T13 preferably have a P channel. For example, transistors T12 and T13 have their sources connected to node 202 and their gates connected to each other, the gate of transistor T12 being further connected to the drain of this transistor T12. For example, the drain of transistor T12, respectively T13, is connected to the drain of transistor T10, respectively T11.

Circuit BUFFa1 further comprises a MOS transistor T14 having its gate connected to a node 600 of connection of transistor T13 to transistor T11, and its source connected to the circuit output 218. Since circuit BUFFa1 delivers voltage VrefH, transistor T14 preferably has an N channel and has its drain connected to node 202.

Preferably, a capacitive element C is connected between the gate and the source of transistor T14 to improve the stability of circuit BUFFa1.

Circuit BUFFa1 further comprises a MOS transistor T15 coupling the differential pair (transistors T10 and T11) to that of nodes 202 and 204 to which transistors T12 and T13 are not connected, and a MOS transistor T16 coupling output 218 to that of nodes 202 and 204 to which transistor T14 is not connected. In the example of FIG. 9, since transistors T12 and T13 are connected to node 202, transistor T15 thus couples the differential pair to node 204, and, further, since transistor T14 is connected to node 202, transistor T16 thus couples output 218 to node 204. In this example, transistors T15 and T16 thus have an N channel. For example, transistors T15 and T16 have their sources connected to node 204, transistor T15 has its drain coupled, preferably connected, to the sources of transistors T10 and T11 of the differential pair, and transistor T16 has its drain coupled, preferably connected, to output 218.

Circuit BUFFa1 further comprises a MOS transistor T17 having a channel of the same type as that of the channels of transistors T15 and T16, that is, having an N channel in this example. This transistor T17 has its source connected to the same node, 204 in this example, as the node to which the sources of transistors T15 and T16 are connected. Transistors T15 and T16 are in a current mirror assembly with transistor T17. For example, the gates of transistors T15 and T16 are each connected to the gate of transistor T17, the gate of transistor T17 being further connected to the drain of transistor T17.

According to an embodiment, transistor T17 is advantageously biased from an intermediate node of the resistive dividing bridge having circuit BUFFa1 connected thereto, that is, from an intermediate node of bridge 208 in this example, for example from node 216 of bridge 208 (FIG. 7).

For example, circuit BUFFa1 comprises a MOS transistor T18 having a channel of the type opposite to that of the channel of transistor T17, and having its source connected to that of nodes 202 and 204 to which transistor T17 is not connected. Thus, in this example, transistor T18 has a P channel and has its source connected to node 202. Further, the gate of transistor T18 is connected to the intermediate node 216 of bridge 208, from which transistor T17 is biased. A resistor R couples the drains of transistors T17 and T18 together.

In an alternative embodiment, transistor T17 may be biased other than from a node of the resistive dividing bridge to which the input 220 of circuit BUFFa1 is connected.

According to an embodiment, to limit the power consumption of circuit BUFFa1 when transistor Ten is in the off state (FIG. 7), circuit BUFFa1 comprises a MOS transistor T19 with a channel of the same type as that of transistor T17, that is, an N channel in this example. Transistor T19 is configured to short-circuit transistor T17 when transistor Ten (FIG. 7) is off. For example, transistor T19 has its source, respectively its drain, connected to the source, respectively the drain, of transistor T17. As an example, for transistor T19 to be on when transistor Ten is off, the gate of transistor T19 is coupled, preferably connected, to the drain of the transistor which is in series with the resistive dividing bridge having the input 220 of circuit BUFFa1 connected thereto, that is, to the drain of transistor Ten in this example.

Although an example of embodiment of the circuit BUFFa1 of the device REFGEN of FIG. 7 has been described hereabove, the circuit BUFFa2 of FIG. 8 may be implemented by the circuit described in relation with FIG. 9. AS an example, in this case, the gate of transistor T10 is connected to node 406 of bridge 400, the gate of transistor T18 is connected to a node of bridge 400, for example to node 408, and the gate of transistor T19 is connected to the drain of transistor T8.

Figure 10:
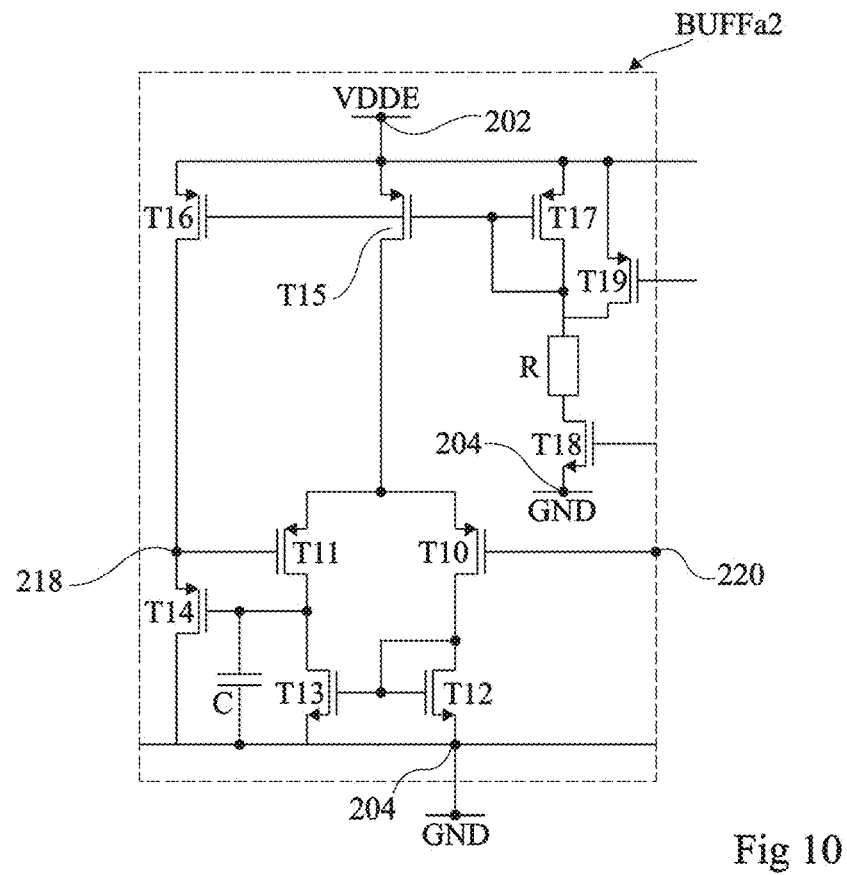
FIG. 10 shows, in the form of a circuit, an example of another embodiment of an analog buffer circuit.

FIG. 10 shows, in the form of a circuit, an example of an embodiment of an analog buffer circuit configured to deliver voltage VrefL. In this example, the described buffer circuit is the circuit BUFFa2 implemented in the circuit REFGEN of FIG. 7.

The circuit BUFFa2 of FIG. 10 is similar to the circuit BUFFa1 of FIG. 9 and comprises many elements in common therewith, only the differences between these two devices being here highlighted.

In particular, since circuit BUFFa2 delivers voltage VrefL, the transistors T10 and T11 of circuit BUFFa2 preferably have a P channel.

Transistor T10 here has its gate connected to the input 220 of circuit BUFFa2, and thus receives, in this example, the voltage present at node 406 of bridge 400 (FIG. 7). Further, transistor T11 here has its gate connected to the output 218 of circuit BUFFa2, and thus receives voltage VrefL.

Since circuit BUFFa2 delivers voltage VrefL, the transistors T12 and T13 assembled as a current mirror with each other to bias the respective transistors T10 and T11 of the differential pair preferably have an N channel. For example, transistors T12 and T13 here have their sources connected to node 204 and their gates connected to each other, the gate of transistor T12 being further connected to the drain of this transistor T12. For example, the drain of transistor T12, respectively T13, is connected to the drain of transistor T10, respectively T11.

Since circuit BUFFa2 delivers voltage VrefL, transistor T14, having its gate connected to node 600 and its source connected to the output 218 of circuit BUFFa2, preferably has a P channel and has its drain connected to node 202.

Preferably, circuit BUFFa2 comprises capacitive element C connected between the gate and the source of transistor T14 to improve its stability.

In this embodiment, transistors T12 and T13 being connected to node 204, transistors T15 and T16 are connected to node 202. Transistor T15 thus couples the differential pair to node 202, and, further, transistor T16 thus couples output 218 to node 202. In this example, transistors T15 and T16 thus have a P channel. For example, transistors T15 and T16 have their sources connected to node 202, transistor T15 has its drain coupled, preferably connected, to the sources of transistors T10 and T11, and transistor T16 has its drain coupled, preferably connected, to output 218.

Transistor T17, having a channel of the same type as that of the channels of transistors T15 and T16 thus has a P channel in circuit BUFFa2, and has its source connected to the same node, 202 in this example, as the node having the sources of transistors T15 and T16 connected thereto. Transistors T15 and T16 are in a current mirror assembly with transistor T17.

According to an embodiment, transistor T17 is advantageously biased from an intermediate node of the resistive dividing bridge having circuit BUFFa2 connected thereto, that is, from an intermediate node of bridge 400 in this example, for example from node 406 of bridge 400 (FIG. 7).

For example, circuit BUFFa2 comprises MOS transistor T18 having a channel of the type opposite to that of the channel of transistor T17, and having its source connected to that of nodes 202 and 204 to which transistor T17 is not connected. Thus, in this example, transistor T18 has an N channel and has its source connected to node 204. Further, the gate of transistor T18 is connected to the intermediate node 406 of bridge 400, from which transistor T17 is biased. Resistor R couples the drains of transistors T17 and T18 together.

In an alternative embodiment, transistor T17 may be biased other than from a node of the resistive dividing bridge having the input 220 of circuit BUFFa2 connected thereto.

According to an embodiment, to limit the power consumption of circuit BUFFa2 when transistor Ten is in the off state (FIG. 7), circuit BUFFa2 comprises a MOS transistor T19 having a channel of the same type as that of transistor T17, that is, a P channel in this example. Transistor T19 is configured to short-circuit transistor T17 when transistor Ten (FIG. 7) is off. For example, transistor T19 has its source, respectively its drain, connected to the source, respectively the drain, of transistor T17. As an example, for transistor T19 to be on when transistor Ten is off, the gate of transistor T19 is coupled, preferably connected, to the drain of the transistor which is in series with the resistive dividing bridge having the input 220 of circuit BUFFa2 connected thereto, that is, to the drain of transistor T8 in this example.

Although an example of embodiment of the circuit BUFFa2 of the device REFGEN of FIG. 7 has been described hereabove, the circuit BUFFa1 of FIG. 8 may be implemented by the circuit described in relation with FIG.

10. As an example, in this case, the gate of the transistor T10 of the circuit of FIG. 10 is connected to node 214 of bridge 208, the gate of transistor T18 is connected to a node of bridge 208, for example to node 216, and the gate of transistor T19 is connected to the drain of transistor Ten.

In the embodiments and variants previously described in relation with FIGS. 4 to 10, each of voltages VrefH and VrefL is generated from voltage VDDE. Thus, each of voltages VrefH and VrefL follows the variations of voltage VDDE, and, in particular, the overvoltages or undervoltages of voltage VDDE. This enables to keep the voltages across the cascode transistors T2 and T3 of structures 100 and 102 at values lower than the breakdown voltage Vmax of these transistors. Further, since each of voltages VrefH and VrefL follows the variations of voltage VDDE and is not generated from voltage VDD, there is no longer any constraint regarding the order in which the power supply voltages VDDE and VDD have to be delivered.

In the embodiments and variants previously described in relation with FIGS. 4 to 10, when transistor Ten is on, each of voltages VrefH and VrefL is generated from voltage VDDE by a corresponding resistive voltage dividing bridge 208 or 400. Thus, the temperature dependence of the current value of each of voltages VrefL and VrefH is decreased or eliminated. Further, the ratio of the current value of voltage VrefH, respectively VrefL, to that of voltage VDDE can easily be selected by adapting the values of one or a plurality of the resistive elements of the corresponding bridge 208 or 400.

Various embodiments and variants have been described. Those skilled in the art will understand that certain features of these various embodiments and variants may be combined, and other variants will occur to those skilled in the art.

Finally, the practical implementation of the described embodiments and variants is within the abilities of those skilled in the art based on the functional indications given hereabove.

What is claimed is:

1. Circuit comprising:
a first node configured to receive a reference potential;
a second node configured to receive a first DC voltage, the first DC voltage being a power supply voltage;
a third node configured to receive a second DC voltage;
a first NMOS transistor having its gate connected to the second node;
a second NMOS transistor having its drain connected to the source of the first transistor and its source connected to the second node;
a third NMOS transistor having its gate connected to the second node and its source connected to the first node;
a fourth PMOS transistor having its drain connected to the drain of the third transistor and to the gate of the second transistor and its gate connected to the source of the first transistor;
a first resistive element connected between the drain of the first transistor and the third node;
a second resistive element connected between the source of the fourth transistor and the third node; and
a first CMOS inverter configured to be powered with the second voltage, an input of the first inverter being connected to the drain of the third transistor and an output of the first inverter being configured to deliver a reset signal.

2. Circuit according to claim 1, wherein each of the first and second resistive elements is implemented by a PMOS transistor having its gate connected to the first node and its source connected to the third node.

3. Circuit according to claim 1, further comprising a capacitive element connected between the gate and source of the first transistor.

4. Circuit according to claim 1, further comprising a second CMOS inverter configured to be powered with the second voltage, an input of the second inverter being connected to the output of the first inverter, and an output of the second inverter being configured to deliver a signal complementary to the reset signal.

5. Circuit according to claim 1, wherein the first and second resistive elements, and the first and fourth transistors are sized so that the fourth transistor is off when the first transistor is on.

6. Circuit according to claim 1, wherein the second voltage also is a power supply voltage.

7. Device comprising:
at least one circuit according to claim 1, and
a voltage generation circuit configured to deliver the second DC voltage at a non-zero value before a powering on and a ramping up of the first voltage, the non-zero value being preferably adapted to allowing a switching to the on state of the fourth transistor from the powering on of the first voltage.

8. Device comprising:
at least two circuits according to claim 1;
a voltage generation circuit configured to deliver the second DC voltage at a non-zero value before a powering on and a ramping up of the first voltage, the non-zero value being preferably adapted to allowing a switching to the on state of the fourth transistor from the powering on of the first voltage;
the device comprises a CMOS logic gate configured to implement a Boolean AND logic function between the reset signals delivered by said at least two circuits, wherein:
the first nodes of said at least two circuits are configured to receive the same reference potential;
the third nodes of said at least two circuits are configured to receive the second voltage delivered by the voltage generation circuit, said second voltage being a reference voltage; and
the second nodes of said at least two circuits are each configured to receive a first DC power supply voltage different from the first voltages received by the second nodes of the other circuits.

9. Device according to claim 8, wherein the CMOS logic gate is configured to be powered with the second voltage delivered by the voltage generation circuit.

10. Device according to claim 8, wherein the voltage generation circuit is configured to deliver the second DC reference voltage at its nominal value prior to the powering on and the ramping up of each of the first voltages.

11. Device according to claim 8, wherein the circuit for generating the second reference voltage comprises:
a first voltage dividing bridge connected between a first power supply node configured to receive one of the first DC power supply voltages and a second power supply node configured to receive the reference potential;
a first MOS transistor and a second resistive voltage dividing bridge connected in series between the first and second power supply nodes, the first transistor having its gate connected to an intermediate node of the first bridge and its source connected to the second power supply node;
a first buffer circuit configured to be powered with said one of the first DC power supply voltages and comprising an input connected to a first intermediate node of the second bridge and an output configured to deliver the second reference voltage; and a second MOS transistor having its drain connected to the output of the first buffer circuit and its source connected to the first power supply node, wherein the first bridge is configured so that the first transistor is off when said one of the first DC power supply voltages is at a value lower than a first threshold, itself lower than a breakdown voltage of the transistors, and wherein the second transistor is configured to be in the on state if the first transistor is off, and conversely.

12. Device according to claim 8, wherein the circuit for generating the second reference voltage comprises:

a first voltage dividing bridge connected between a first power supply node configured to receive one of the first DC power supply voltages and a second power supply node configured to receive the reference potential;

a first MOS transistor and a second resistive voltage dividing bridge connected in series between the first and second power supply nodes, the first transistor having its gate connected to an intermediate node of the first bridge and its source connected to the first power supply node;

a second MOS transistor and a third resistive voltage dividing bridge connected in series between the first and second power supply nodes, the source of the second MOS transistor being connected to the second power supply node;

a buffer circuit configured to be powered with said one of the first DC power supply voltages and comprising an input connected to a first intermediate node of the third bridge and an output configured to deliver the second reference voltage; and a third MOS transistor having its drain connected to the output of the buffer circuit and its source connected to the first power supply node;

wherein the second transistor is configured to be in the off, respectively on, state when the first transistor is in the off, respectively on, state, wherein the third transistor is configured to be in the on state if the second transistor is in the off state, and conversely, and wherein the first bridge is configured so that the first transistor is off when said one of the first DC power supply voltages is at a value lower than a first threshold, itself lower than a breakdown voltage of the transistors.

\* \* \* \* \*